United States Patent
Spirkl et al.

(10) Patent No.: US 11,762,592 B2
(45) Date of Patent: Sep. 19, 2023

(54) RECEIVE-SIDE CROSSTALK CANCELATION

(71) Applicant: Micron Technology, Inc., Boise, ID (US)

(72) Inventors: Wolfgang Anton Spirkl, Germering (DE); Peter Mayer, Neubiberg (DE); Martin Brox, Munich (DE); Michael Dieter Richter, Ottobrunn (DE); Thomas Hein, Munich (DE)

(73) Assignee: Micron Technology, Inc., Boise, ID (US)

( * ) Notice: Subject to any disclaimer, the term of this patent is extended or adjusted under 35 U.S.C. 154(b) by 51 days.

(21) Appl. No.: 17/462,982

(22) Filed: Aug. 31, 2021

(65) Prior Publication Data

US 2021/0397381 A1    Dec. 23, 2021

Related U.S. Application Data

(63) Continuation of application No. 16/809,449, filed on Mar. 4, 2020, now Pat. No. 11,119,700.
(Continued)

(51) Int. Cl.
G06F 3/00     (2006.01)
G06F 3/06     (2006.01)
G11C 11/22    (2006.01)

(52) U.S. Cl.
CPC .......... *G06F 3/0659* (2013.01); *G06F 3/0604* (2013.01); *G06F 3/0679* (2013.01);
(Continued)

(58) Field of Classification Search
CPC . G11C 11/221; G11C 11/2273; G11C 11/419; G11C 7/1048; G11C 11/2255;
(Continued)

(56) References Cited

U.S. PATENT DOCUMENTS 5,898,619 A      4/1999  Chang et al.
9,432,020 B2 *   8/2016  Canegallo .......... H03K 19/0948
(Continued)

FOREIGN PATENT DOCUMENTS

CN    108696117 A    10/2018
KR    10-0894489 B1   4/2009
(Continued)

OTHER PUBLICATIONS

ISA/KR, International Search Report and Written Opinion of the International Searching Authority, Int'l. Appl. No. PCT/US2020/021749, dated Jul. 2, 2020, Korean Intellectual Property Office, Seo-gu, Daejeon, Republic of Korea, 10 pgs.
(Continued)

*Primary Examiner* — Thong Q Le

(74) *Attorney, Agent, or Firm* — Holland & Hart LLP

(57) ABSTRACT

Methods, systems, and devices for receive-side crosstalk cancelation are described. A device that receives multiple signals over different transmission lines may include a circuit for canceling crosstalk. The circuit may include one or more capacitors or inductors that are coupled with the inputs of multiple receive circuits. The circuit may also include a set of resistors that are coupled with the receive circuits. In some cases, the device may dynamically configure the cancelation circuit to provide a particular bandwidth or strength of cancelation. In such cases, the device may configure the circuit autonomously or based on control information from another device.

20 Claims, 11 Drawing Sheets

Related U.S. Application Data

(60) Provisional application No. 62/816,480, filed on Mar. 11, 2019.

(52) U.S. Cl.
CPC ........ *G11C 11/221* (2013.01); *G11C 11/2297* (2013.01); *G11C 11/2255* (2013.01); *G11C 11/2257* (2013.01); *G11C 11/2273* (2013.01)

(58) Field of Classification Search
CPC ............ G11C 11/2257; G11C 11/2297; G11C 11/4093; G11C 11/41; G11C 29/025; G11C 29/028; G11C 7/02; G11C 7/1063; G11C 7/1084; G11C 7/1006; G11C 8/08; G11C 7/12; G11C 7/24; G11C 11/4076; G11C 11/4096; G11C 7/1012; G11C 7/1051; G11C 7/1069; G11C 7/22; G11C 7/222; G11C 29/76; G11C 8/12; G11C 29/00; G11C 29/88; G11C 29/883; G11C 15/04; G11C 5/00; G11C 11/1673; G11C 11/4087; G11C 11/409; G11C 11/4097; G11C 11/56; G11C 11/5607; G11C 11/5642; G11C 11/5678; G11C 13/0004; G11C 13/004; G11C 14/00; G11C 14/0072; G11C 15/00; G11C 15/046; G11C 16/04; G11C 16/06; G11C 16/102; G11C 16/26; G11C 17/00; G11C 19/00; G11C 19/28; G11C 2013/005; G11C 2029/1204; G11C 2207/104; G11C 2207/2227; G11C 2211/5614; G11C 29/38; G11C 29/44; G11C 29/783; G11C 29/806; G11C 29/846; G11C 5/14; G11C 5/143; G11C 7/10; G11C 8/00; G11C 8/10; G11C 8/14; G11C 8/20
See application file for complete search history.

(56) References Cited

U.S. PATENT DOCUMENTS

| | | |
|---|---|---|
| 2003/0007217 A1 | 4/2003 | Cernea et al. |
| 2009/0040840 A1 | 2/2009 | Lee |
| 2009/0190421 A1 | 7/2009 | Park et al. |
| 2009/0273995 A1 | 11/2009 | Lee et al. |
| 2012/0072153 A1 | 3/2012 | Liaw et al. |
| 2012/0182044 A1 | 7/2012 | Oh |
| 2017/0199242 A1 | 7/2017 | Liaw et al. |
| 2018/0137903 A1 | 5/2018 | Desimone |
| 2018/0364841 A1 | 12/2018 | Shahparnia et al. |

FOREIGN PATENT DOCUMENTS

| | | |
|---|---|---|
| KR | 10-2009-0079656 A | 7/2009 |
| KR | 10-0936796 B1 | 1/2010 |
| KR | 10-2013-0139848 A | 12/2013 |

OTHER PUBLICATIONS

European Patent Office, "Supplementary European search report and Search Opinion", issued in connection with European Patent Application No. 20769684.0 dated May 6, 2022 (7 pages).

Chinese Patent Office, "Office Action and Search Report", issued in connection with Chinese Patent Application No. 202080020196, dated Mar. 24, 2022 (7 pages).

Notice of Allowance received for Korean Patent Application No. 10-2021-7032240, dated Jan. 26, 2022, 4 pages (2 pages of English Translation and 2 pages of Original Document).

* cited by examiner

RECEIVE-SIDE CROSSTALK CANCELATION

CROSS REFERENCE

The present Application for Patent is a continuation of U.S. patent application Ser. No. 16/809,449 by Spirkl et al, entitled "RECEIVE-SIDE CROSSTALK CANCELATION" filed Mar. 4, 2020, which claims priority to U.S. Provisional Patent Application No. 62/816,480 by Spirkl et al., entitled "RECEIVE-SIDE CROSSTALK CANCELATION" filed Mar. 11, 2019, each of which is assigned to the assignee hereof and expressly incorporated by reference herein in its entirety.

BACKGROUND

The following relates generally to a system that includes at least one memory device and more specifically to receive-side crosstalk cancelation.

Memory devices are widely used to store information in various electronic devices such as computers, wireless communication devices, cameras, digital displays, and the like. Information is stored by programming different states of a memory device. For example, binary devices most often store one of two states, often denoted by a logic 1 or a logic 0. In other devices, more than two states may be stored. To access the stored information, a component of the device may read, or sense, at least one stored state in the memory device. To store information, a component of the device may write, or program, the state in the memory device.

Various types of memory devices exist, including magnetic hard disks, random access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Non-volatile memory, e.g., FeRAM, may maintain their stored logic state for extended periods of time even in the absence of an external power source. Volatile memory devices, e.g., DRAM, may lose their stored state when disconnected from an external power source. FeRAM, as one example, may be able to achieve densities similar to volatile memory but may have non-volatile properties due to the use of a ferroelectric capacitor as a storage device.

Information may be transferred between a memory device and a processing device by sending electrical signals over transmission lines. Improved solutions for mitigating crosstalk or other forms of interference between transmission lines may be desired.

DETAILED DESCRIPTION

Figure 1:
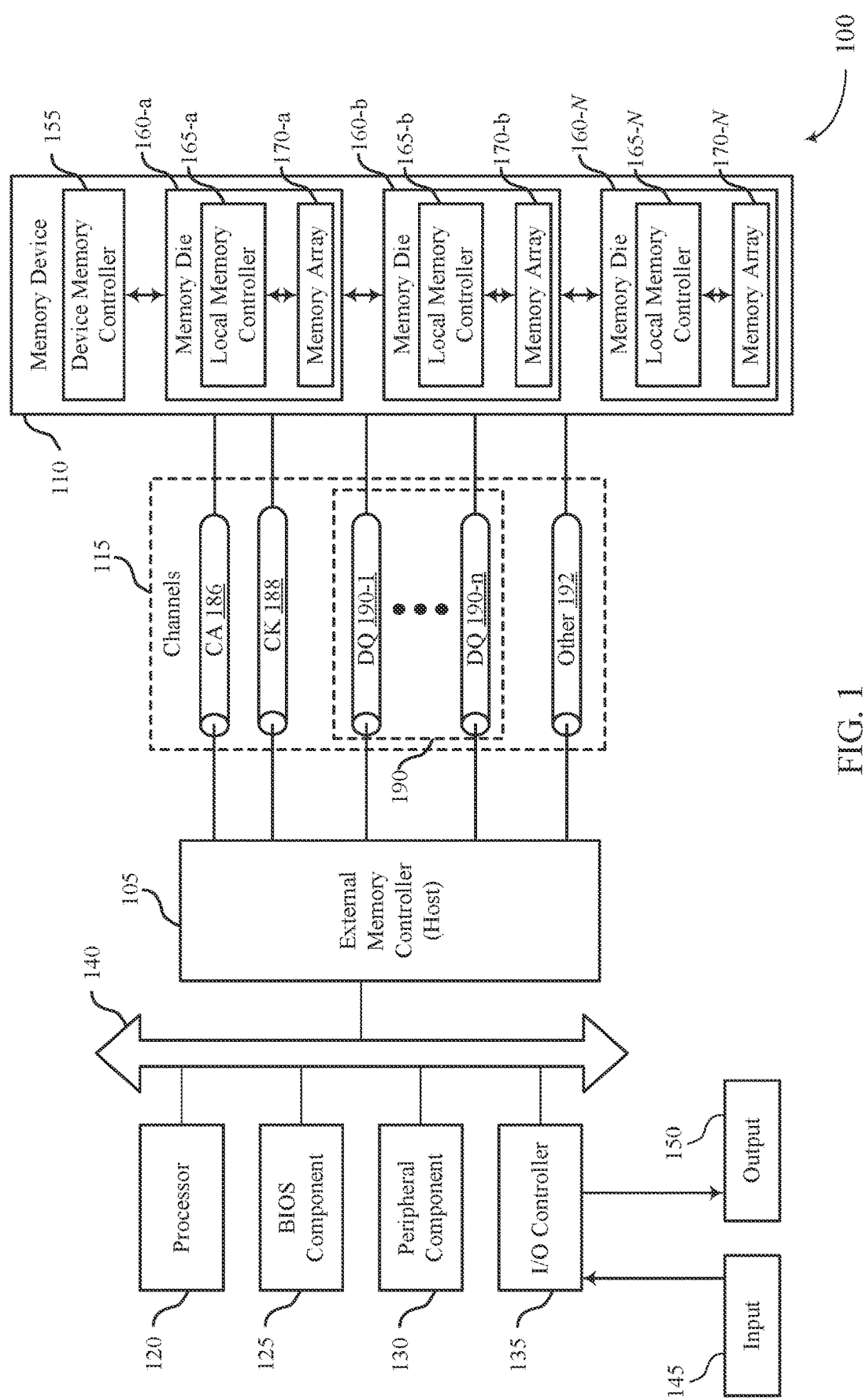
FIG. 1 illustrates an example of a system that supports receive-side crosstalk cancelation in accordance with various examples as disclosed herein.

A memory device may mitigate crosstalk between transmission lines by way of a cancelation circuit, which may be positioned between a receiver of the memory device and a transmitter in some examples. The cancelation circuit may be dynamically or statically configured and may introduce crosstalk contributions based on crosstalk experienced by one transmission line (e.g., a transmission line conveying data signals) to another transmission line (e.g., a transmission line conveying a reference signal).

In some systems or devices, data to be stored or data retrieved from storage may be exchanged between a processing unit (e.g., a graphics processing unit (GPU), general purpose GPU (GPGPU), central processing unit (CPU)) and a memory device (e.g., DRAM) via one or more transmission lines. But in some examples the proximity of the transmission lines may result in undesired contributions (e.g., interference) to some data signals during propagation. For example, crosstalk may arise when multiple signals are sent (e.g., concurrently) over closely-spaced transmissions lines (e.g., due to capacitive or inductive coupling). Such crosstalk, which may also be referred to as cross coupling, may adversely affect or corrupt the signal and result in one or more data errors at the device receiving the signal. Thus, incorrect data may be stored or interpreted as having been retrieved, which may negatively impact performance. Because crosstalk increases with reduced spacing between transmission lines, a device's performance may suffer as the quantity of input/outputs (IOs) increases, the proximity of IOs increases, or both. This issue may be exacerbated in some systems, including those that use single-ended transmission techniques which-unlike differential transmission techniques-do not inherently mitigate crosstalk.

According to the techniques described herein, a device that receives signals over transmission lines may cancel crosstalk (e.g., passively) that arises from the concurrent transmission of the signals. Passive cancelation may refer to cancelation that involves passive components (e.g., resistors, capacitors, inductors, and transformers) or cancelation that does not involve active generation of a cancelation signal. For example, a device may include a cancelation circuit to cancel crosstalk contributions added to a victim signal by adding the contributions (e.g., the same contributions, contributions based on crosstalk effects) to a reference signal used to detect the information conveyed by the victim signal. The cancelation circuit may add the contributions to the reference signal. In some example, this may occur after the data signal has been transmitted but before the data signal or the reference signal has been received by a receiver of the device. The components that participate in the cancelation may be pre-configured or may be selected dynamically (e.g., based at least in part on crosstalk measurements among other factors).

Features of the disclosure introduced above are further described with reference to FIGS. 1 through 3 in the context of memory devices, systems, and circuits that support receive-side cancelation. Specific examples are then described with reference to FIGS. 4 through 7, which illustrate cancelation circuit examples that compensate for crosstalk. These and other features of the disclosure are further described with respect to FIGS. 8 through 12, which illustrate process flows, apparatus diagrams, and flowcharts that support receive-side cancelation.

FIG. 1 illustrates an example of a system 100 that supports receive-side crosstalk cancelation in accordance with various examples as disclosed herein. The system 100 may include an external memory controller 105, a memory device 110, and a plurality of channels 115 coupling the external memory controller 105 with the memory device 110. The system 100 may include one or more memory devices, but for ease of description the one or more memory devices may be described as a single memory device 110.

The system 100 may include aspects of an electronic device, such as a computing device, a mobile computing device, a wireless device, or a graphics processing device. The system 100 may be an example of a portable electronic device. The system 100 may be an example of a computer, a laptop computer, a tablet computer, a smartphone, a cellular phone, a wearable device, an internet-connected device, or the like. The memory device 110 may be component of the system configured to store data for one or more other components of the system 100. In some examples, the system 100 may be configured for bi-directional wireless communication with other systems or devices (e.g., using a base station or access point). In some examples, the system 100 is capable of machine-type communication (MTC), machine-to-machine (M2M) communication, or device-to-device (D2D) communication.

At least portions of the system 100 may be examples of a host device. Such a host device may be an example of a device that uses memory to execute processes such as a computing device, a mobile computing device, a wireless device, a graphics processing device, a computer, a laptop computer, a tablet computer, a smartphone, a cellular phone, a wearable device, an internet-connected device, some other stationary or portable electronic device, or the like. In some cases, the host device may refer to the hardware, firmware, software, or a combination thereof that implements the functions of the external memory controller 105. In some cases, the external memory controller 105 may be referred to as a host, host device (e.g., a graphics processing unit (GPU)), or processing device. According to the techniques described herein, a host device may receive information indicating or regarding crosstalk that affects one or more signals (e.g., transmitted from the host device to a memory device). The information may indicate various characteristics of the crosstalk (e.g., its time constant or severity). Based on the characteristics of the crosstalk, a device, such as the host device, may instruct another device, such as the memory device, on how to configure one or more cancelation circuits.

In some cases, a memory device 110 may be an independent device or component that is configured to be in communication with other components of the system 100 and provide physical memory addresses/space to potentially be used or referenced by the system 100. In some examples, a memory device 110 may be configurable to work with at least one or a plurality of different types of systems 100. Signaling between the components of the system 100 and the memory device 110 may be operable to support modulation schemes to modulate the signals, different pin designs for communicating the signals, distinct packaging of the system 100 and the memory device 110, clock signaling and synchronization between the system 100 and the memory device 110, timing conventions, and/or other factors.

The memory device 110 may be configured to store data for the components of the system 100. In some cases, the memory device 110 may act as a slave-type device to the system 100 (e.g., responding to and executing commands provided by the system 100 through the external memory controller 105). Such commands may include an access command for an access operation, such as a write command for a write operation, a read command for a read operation, a refresh command for a refresh operation, or other commands. The memory device 110 may include two or more memory dice 160 (e.g., memory chips) to support a desired or specified capacity for data storage. The memory device 110 including two or more memory dice may be referred to as a multi-die memory or package (also referred to as multi-chip memory or package).

The system 100 may further include a processor 120, a basic input/output system (BIOS) component 125, one or more peripheral components 130, and an input/output (I/O) controller 135. The components of system 100 may be in electronic communication with one another using a bus 140.

The processor 120 may be configured to control at least portions of the system 100. The processor 120 may be a general-purpose processor, a digital signal processor (DSP), an application-specific integrated circuit (ASIC), a field-programmable gate array (FPGA) or other programmable logic device, discrete gate or transistor logic, discrete hardware components, or it may be a combination of these types of components. In such cases, the processor 120 may be an example of a central processing unit (CPU), a graphics processing unit (GPU), a general purpose graphic processing unit (GPGPU), or a system on a chip (SoC), among other examples.

The BIOS component 125 may be a software component that includes a BIOS operated as firmware, which may initialize and run various hardware components of the system 100. The BIOS component 125 may also manage data flow between the processor 120 and the various components of the system 100, e.g., the peripheral components 130, the I/O controller 135, etc. The BIOS component 125 may include a program or software stored in read-only memory (ROM), flash memory, or any other non-volatile memory.

The peripheral component(s) 130 may be any input device or output device, or an interface for such devices, that may be integrated into or with the system 100. Examples may include disk controllers, sound controller, graphics controller, Ethernet controller, modem, universal serial bus (USB) controller, a serial or parallel port, or peripheral card slots, such as peripheral component interconnect (PCI) or specialized graphics ports. The peripheral component(s) 130 may be other components understood by those skilled in the art as peripherals.

The I/O controller 135 may manage data communication between the processor 120 and the peripheral component(s) 130, input devices 145, or output devices 150. The I/O controller 135 may manage peripherals that are not integrated into or with the system 100. In some cases, the I/O controller 135 may represent a physical connection or port to external peripheral components.

The input 145 may represent a device or signal external to the system 100 that provides information, signals, or data to the system 100 or its components. This may include a user interface or interface with or between other devices. In some cases, the input 145 may be a peripheral that interfaces with system 100 via one or more peripheral components 130 or may be managed by the I/O controller 135.

The output 150 may represent a device or signal external to the system 100 configured to receive an output from the system 100 or any of its components. Examples of the output 150 may include a display, audio speakers, a printing device, or another processor on printed circuit board, and so forth. In some cases, the output 150 may be a peripheral that interfaces with the system 100 via one or more peripheral components 130 or may be managed by the I/O controller 135.

The components of system 100 may be made up of general-purpose or special purpose circuitry designed to carry out their functions. This may include various circuit elements, for example, conductive lines, transistors, capacitors, inductors, transformers, resistors, amplifiers, or other active or passive elements, configured to carry out the functions described herein. In some examples, active elements may be components (e.g., transistors and amplifiers) that consume power or use energy to function. In some examples, passive elements may refer to components that does not consume power or use energy to function (e.g., capacitors, resistors, inductors, and transformers).

The memory device 110 may include a device memory controller 155 and one or more memory dice 160. Each memory die 160 may include a local memory controller 165 (e.g., local memory controller 165-a, local memory controller 165-b, and/or local memory controller 165-N) and a memory array 170 (e.g., memory array 170-a, memory array 170-b, and/or memory array 170-N). A memory array 170 may be a collection (e.g., a grid) of memory cells, with each memory cell being configured to store at least one bit of digital data. Features of memory arrays 170 and/or memory cells are described in more detail with reference to FIG. 2.

The memory device 110 may be an example of a two-dimensional (2D) array of memory cells or may be an example of a three-dimensional (3D) array of memory cells. For example, a 2D memory device may include a single memory die 160. A 3D memory device may include two or more memory dice 160 (e.g., memory die 160-a, memory die 160-b, and/or any quantity of memory dice 160-N). In a 3D memory device, a plurality of memory dice 160-N may be stacked on top of one another or next to one another. In some cases, memory dice 160-N in a 3D memory device may be referred to as decks, levels, layers, or dies. A 3D memory device may include any quantity of stacked memory dice 160-N (e.g., two high, three high, four high, five high, six high, seven high, eight high). This may increase the quantity of memory cells that may be positioned on a substrate as compared with a single 2D memory device, which in turn may reduce production costs or increase the performance of the memory array, or both. In some 3D memory device, different decks may share at least one common access line such that some decks may share at least one of a word line, a digit line, and/or a plate line.

The device memory controller 155 may include circuits or components configured to control operation of the memory device 110. As such, the device memory controller 155 may include the hardware, firmware, and software that enables the memory device 110 to perform commands and may be configured to receive, transmit, or execute commands, data, or control information related to the memory device 110. The device memory controller 155 may be configured to communicate with the external memory controller 105, the one or more memory dice 160, or the processor 120. In some cases, the memory device 110 may receive data and/or commands from the external memory controller 105. For example, the memory device 110 may receive a write command indicating that the memory device 110 is to store certain data on behalf of a component of the system 100 (e.g., the processor 120) or a read command indicating that the memory device 110 is to provide certain data stored in a memory die 160 to a component of the system 100 (e.g., the processor 120). In some cases, the device memory controller 155 may control operation of the memory device 110 described herein in conjunction with the local memory controller 165 of the memory die 160. Examples of the components included in the device memory controller 155 and/or the local memory controllers 165 may include receivers for demodulating signals received from the external memory controller 105, decoders for modulating and transmitting signals to the external memory controller 105, logic, decoders, amplifiers, filters, or the like.

The local memory controller 165 (e.g., local to a memory die 160) may be configured to control operations of the memory die 160. Also, the local memory controller 165 may be configured to communicate (e.g., receive and transmit data and/or commands) with the device memory controller 155. The local memory controller 165 may support the device memory controller 155 to control operation of the memory device 110 as described herein. In some cases, the memory device 110 does not include the device memory controller 155, and the local memory controller 165 or the external memory controller 105 may perform the various functions described herein. As such, the local memory controller 165 may be configured to communicate with the device memory controller 155, with other local memory controllers 165, or directly with the external memory controller 105 or the processor 120.

The external memory controller 105 may be configured to enable communication of information, data, and/or commands between components of the system 100 (e.g., the processor 120) and the memory device 110. The external memory controller 105 may act as a liaison between the components of the system 100 and the memory device 110 so that the components of the system 100 may not need to know the details of the memory device's operation. The components of the system 100 may present requests to the external memory controller 105 (e.g., read commands or write commands) that the external memory controller 105 satisfies. The external memory controller 105 may convert or translate communications exchanged between the components of the system 100 and the memory device 110. In some cases, the external memory controller 105 may include a system clock that generates a common (source) system clock signal. In some cases, the external memory controller 105 may include a common data clock that generates a common (source) data clock signal. As discussed herein, the external memory controller 105 may communicate with a memory device 110 regarding crosstalk characteristics and cancelation.

In some cases, the external memory controller 105 or other component of the system 100, or its functions described herein, may be implemented by the processor 120. For example, the external memory controller 105 may be hardware, firmware, or software, or some combination thereof implemented by the processor 120 or other component of the system 100. While the external memory controller 105 is depicted as being external to the memory device 110, in some cases, the external memory controller 105, or its functions described herein, may be implemented by a memory device 110. For example, the external memory controller 105 may be hardware, firmware, or software, or some combination thereof implemented by the device memory controller 155 or one or more local memory controllers 165. In some cases, the external memory controller 105 may be distributed across the processor 120 and the memory device 110 such that portions of the external memory controller 105 are implemented by the processor 120 and other portions are implemented by a device memory controller 155 or a local memory controller 165. Likewise, in some cases, one or more functions ascribed herein to the device memory controller 155 or local memory controller 165 may in some cases be performed by the external memory controller 105 (either separate from or as included in the processor 120).

The components of the system 100 may exchange information with the memory device 110 using a plurality of channels 115. In some examples, the channels 115 may enable communications between the external memory controller 105 and the memory device 110. Each channel 115 may include one or more signal paths or transmission mediums (e.g., conductors) between terminals associated with the components of system 100. For example, a channel 115 may include a first terminal including one or more pins or pads at external memory controller 105 and one or more pins or pads at the memory device 110. A pin may be an example of a conductive input or output point of a device of the system 100, and a pin may be configured to act as part of a channel. In some cases, a pin or pad of a terminal may be part of to a signal path of the channel 115.

Additional signal paths may be coupled with a terminal of a channel for routing signals within a component of the system 100. For example, the memory device 110 may include signal paths (e.g., signal paths internal to the memory device 110 or its components, such as internal to a memory die 160) that route a signal from a terminal of a channel 115 to the various components of the memory device 110 (e.g., a device memory controller 155, memory dice 160, local memory controllers 165, memory arrays 170).). A signal path may be implemented using one or more types of transmission lines, including differential transmission lines and single-ended transmission lines.

Channels 115 (and associated signal paths and terminals) may be dedicated to communicating specific types of information. In some cases, a channel 115 may be an aggregated channel and thus may include multiple individual channels. For example, a data channel 190 may be ×4 (e.g., including four signal paths), ×8 (e.g., including eight signal paths), ×16 (including sixteen signal paths), and so forth. Signals communicated over the channels may use a double data rate (DDR) timing scheme. For example, some symbols of a signal may be registered on a rising edge of a clock signal and other symbols of the signal may be registered on a falling edge of the clock signal. Signals communicated over channels may use single data rate (SDR) signaling. For example, one symbol of the signal may be registered for each clock cycle.

In some cases, the channels 115 may include one or more command and address (CA) channels 186. The CA channels 186 may be configured to communicate commands between the external memory controller 105 and the memory device 110 including control information associated with the commands (e.g., address information). For example, the CA channel 186 may include a read command with an address of the desired data. In some cases, the CA channels 186 may be registered on a rising clock signal edge and/or a falling clock signal edge. In some cases, a CA channel 186 may include any quantity of signal paths to decode address and command data (e.g., eight or nine signal paths).

In some cases, the channels 115 may include one or more clock signal (CK) channels 188. The CK channels 188 may be configured to communicate one or more common clock signals between the external memory controller 105 and the memory device 110. Each clock signal may be configured to oscillate between a high state and a low state and coordinate the actions of the external memory controller 105 and the memory device 110. In some cases, the clock signal may be a differential output (e.g., a CK_t signal and a CK_c signal) and the signal paths of the CK channels 188 may be configured accordingly. In some cases, the clock signal may be single ended. A CK channel 188 may include any quantity of signal paths. In some cases, the clock signal CK (e.g., a CK_t signal and a CK_c signal) may provide a timing reference for command and addressing operations for the memory device 110, or other system-wide operations for the memory device 110. The clock signal CK therefore may be variously referred to as a control clock signal CK, a command clock signal CK, or a system clock signal CK. The system clock signal CK may be generated by a system clock, which may include one or more hardware components (e.g., oscillators, crystals, logic gates, transistors, or the like).

In some cases, the channels 115 may include one or more data (DQ) channels 190. The data channels 190 may be configured to communicate data and/or control information between the external memory controller 105 and the memory device 110. For example, the data channels 190 may communicate information (e.g., bi-directional) to be written to the memory device 110 or information read from the memory device 110.

In some cases, the channels 115 may include one or more other channels 192 that may be dedicated to other purposes. These other channels 192 may include any quantity of signal paths.

In some cases, the other channels 192 may include one or more write clock signal (WCK) channels. While the 'W' in WCK may nominally stand for "write," a write clock signal WCK (e.g., a WCK_t signal and a WCK_c signal) may provide a timing reference for access operations generally for the memory device 110 (e.g., a timing reference for both read and write operations). Accordingly, the write clock signal WCK may also be referred to as a data clock signal WCK. The WCK channels may be configured to communicate a common data clock signal between the external memory controller 105 and the memory device 110. The data clock signal may be configured to coordinate an access operation (e.g., a write operation or read operation) of the external memory controller 105 and the memory device 110. In some cases, the write clock signal may be a differential output (e.g., a WCK_t signal and a WCK_c signal) and the signal paths of the WCK channels may be configured accordingly. A WCK channel may include any quantity of signal paths. The data clock signal WCK may be generated by a data clock, which may include one or more hardware components (e.g., oscillators, crystals, logic gates, transistors, or the like).

In some cases, the other channels 192 may include one or more error detection code (EDC) channels. The EDC channels may be configured to communicate error detection signals, such as checksums, to improve system reliability. An EDC channel may include any quantity of signal paths.

The channels 115 may couple the external memory controller 105 with the memory device 110 using a variety of different architectures. Examples of the various architectures may include a bus, a point-to-point connection, a crossbar, a high-density interposer such as a silicon interposer, or channels formed in an organic substrate or some combination thereof. For example, in some cases, the signal paths may at least partially include a high-density interposer, such as a silicon interposer or a glass interposer.

Signals communicated over the channels 115 may be modulated using a variety of different modulation schemes. In some cases, a binary-symbol (or binary-level) modulation scheme may be used to modulate signals communicated between the external memory controller 105 and the memory device 110. A binary-symbol modulation scheme may be an example of a M-ary modulation scheme where M is equal to two. Each symbol of a binary-symbol modulation scheme may be configured to represent one bit of digital data (e.g., a symbol may represent a logic 1 or a logic 0). Examples of binary-symbol modulation schemes include, but are not limited to, non-return-to-zero (NRZ), unipolar encoding, bipolar encoding. Manchester encoding, pulse amplitude modulation (PAM) having two symbols (e.g., PAM2), and/or others.

In some cases, a multi-symbol (or multi-level) modulation scheme may be used to modulate signals communicated between the external memory controller 105 and the memory device 110. A multi-symbol modulation scheme may be an example of a M-ary modulation scheme where M is greater than or equal to three. Each symbol of a multi-symbol modulation scheme may be configured to represent more than one bit of digital data (e.g., a symbol may represent a logic 00, a logic 01, a logic 10, or a logic 11). Examples of multi-symbol modulation schemes include, but are not limited to, PAM4, PAM8, etc., quadrature amplitude modulation (QAM), quadrature phase shift keying (QPSK), and/or others. A multi-symbol signal or a PAM4 signal may be a signal that is modulated using a modulation scheme that includes at least three levels to encode more than one bit of information. Multi-symbol modulation schemes and symbols may alternatively be referred to as non-binary, multi-bit, or higher-order modulation schemes and symbols.

In some cases, a device that receives signals via channels 115 may mitigate the effects of crosstalk via a cancelation circuit. For example, when crosstalk contributions are added to data signals, the cancelation circuit may introduce the same (or nearly the same, e.g., similar) crosstalk contributions to the reference signals corresponding to the data signals. The production of the crosstalk contributions may arise from the configuration of the cancelation circuit, which may be preconfigured or may be dynamically adjusted.

Figure 2:
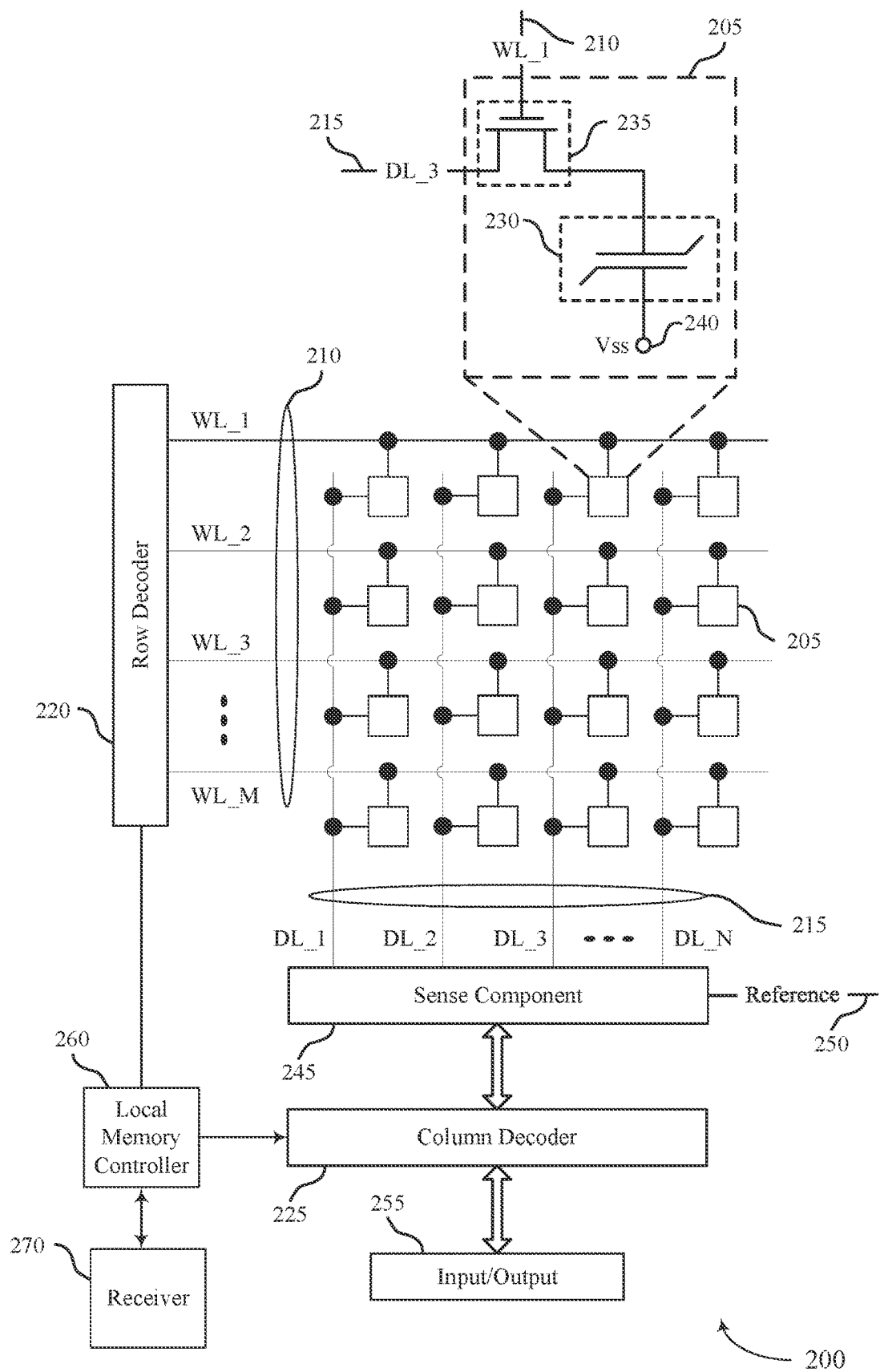
FIG. 2 illustrates an example of a memory die that supports receive-side crosstalk cancelation in accordance with various examples as disclosed herein.

FIG. 2 illustrates an example of a memory die 200 that supports receive-side crosstalk cancelation in accordance with various examples as disclosed herein. The memory die 200 may be an example of the memory dice 160 described with reference to FIG. 1. In some cases, the memory die 200 may be referred to as a memory chip, a memory device, or an electronic memory apparatus. The memory die 200 may include one or more memory cells 205 that are programmable to store different logic states. Each memory cell 205 may be programmable to store two or more states. For example, the memory cell 205 may be configured to store one bit of digital logic at a time (e.g., a logic 0 and a logic 1). In some cases, a single memory cell 205 (e.g., a multi-level memory cell) may be configured to store more than one bit of digit logic at a time (e.g., a logic 00, logic 01, logic 10, or a logic 11).

A memory cell 205 may store a state (e.g., polarization state or dielectric charge) that represents digital data. In FeRAM architectures, the memory cell 205 may include a capacitor that may include a ferroelectric material to store a charge and/or a polarization representative of the programmable state. In DRAM architectures, the memory cell 205 may include a capacitor that includes a dielectric material to store a charge representative of the programmable state.

Operations such as reading and writing may be performed on memory cells 205 by activating or selecting access lines such as a word line 210, a digit line 215, and/or a plate line 220. In some cases, digit lines 215 may also be referred to as bit lines. References to access lines, word lines, digit lines, plate lines or their analogues, are interchangeable without loss of understanding or operation. Activating or selecting a word line 210, a digit line 215, or a plate line 220 may include applying a voltage to the respective line.

The memory die 200 may include the access lines (e.g., the word lines 210, the digit lines 215, and the plate lines 220) arranged in a grid-like pattern. Memory cells 205 may be positioned at intersections of the word lines 210, the digit lines 215, and/or the plate lines 220. By biasing a word line 210, a digit line 215, and a plate line 220 (e.g., applying a voltage to the word line 210, digit line 215, or plate line 220), a single memory cell 205 may be accessed at their intersection.

Accessing the memory cells 205 may be controlled through a row decoder 225, a column decoder 230, and a plate driver 235. For example, a row decoder 225 may receive a row address from the local memory controller 265 and activate a word line 210 based on the received row address. A column decoder 230 receives a column address from the local memory controller 265 and activates a digit line 215 based on the received column address. A plate driver 235 may receive a plate address from the local memory controller 265 and may activate a plate line 220 based on the received plate address. For example, the memory die 200 may include multiple word lines 210, labeled WL_1 through WL_M, multiple digit lines 215, labeled DL_1 through DL_N, and multiple plate lines, labeled PL_1 through PL_P, where M, N, and P depend on the size of the memory array. Thus, by activating a word line 210, a digit line 215, and a plate line 220, e.g., WL_1. DL_3, and PL_1, the memory cell 205 at their intersection may be accessed. The intersection of a word line 210 and a digit line 215, in either a two-dimensional or three-dimensional configuration, may be referred to as an address of a memory cell 205. In some cases, the intersection of a word line 210, a digit line 215, and a plate line 220 may be referred to as an address of the memory cell 205.

The memory cell 205 may include a logic storage component, such as capacitor 240, and a switching component 245. The capacitor 240 may be an example of a ferroelectric capacitor. A first node of the capacitor 240 may be coupled with the switching component 245 and a second node of the capacitor 240 may be coupled with a plate line 220. The switching component 245 may be an example of a transistor or any other type of switch device that selectively establishes or de-establishes electronic communication between two components.

Selecting or deselecting the memory cell 205 may be accomplished by activating or deactivating the switching component 245. The capacitor 240 may be in electronic communication with the digit line 215 using the switching component 245. For example, the capacitor 240 may be isolated from digit line 215 when the switching component 245 is deactivated, and the capacitor 240 may be coupled with digit line 215 when the switching component 245 is activated. In some cases, the switching component 245 is a transistor and its operation is controlled by applying a voltage to a transistor gate, where the voltage differential between the transistor gate and transistor source is greater or less than a threshold voltage of the transistor. In some cases, the switching component 245 may be a p-type transistor or an n-type transistor. The word line 210 may be in electronic communication with the gate of the switching component 245 and may activate/deactivate the switching component 245 based on a voltage being applied to word line 210.

A word line 210 may be a conductive line that is used to perform access operations on memory cell(s) 205 with which it is in electronic communication. In some architectures, the word line 210 may be in electronic communication with a gate of a switching component 245 of a memory cell 205 and may be configured to control the switching component 245 of the memory cell. In some architectures, the word line 210 may be in electronic communication with a node of the capacitor of the memory cell 205 and the memory cell 205 may not include a switching component.

A digit line 215 may be a conductive line that connects the memory cell 205 with a sense component 250. In some architectures, the memory cell 205 may be selectively coupled with the digit line 215 during portions of an access operation. For example, the word line 210 and the switching component 245 of the memory cell 205 may be configured to selected couple and/or isolate the capacitor 240 of the memory cell 205 and the digit line 215. In some architectures, the memory cell 205 may be in electronic communication (e.g., constant) with the digit line 215.

A plate line 220 may be a conductive line that is used to perform access operations on memory cell(s) 205 with which it is in electronic communication. The plate line 220 may be in electronic communication with a node (e.g., the cell bottom) of the capacitor 240. The plate line 220 may be configured (e.g., with the digit line 215) to bias the capacitor 240 during an access operation of the memory cell 205.

The sense component 250 may be configured to detect a state (e.g., a polarization state or a charge) stored on the capacitor 240 of the memory cell 205 and determine a logic state of the memory cell 205 based on the detected state. The charge stored by a memory cell 205 may be extremely small, in some cases. As such, the sense component 250 may include one or more sense amplifiers to amplify the signal output of the memory cell 205. The sense amplifiers may detect minute changes in the charge of a digit line 215 during a read operation and may produce signals corresponding to either a logic 0 or a logic 1 based on the detected charge.

During a read operation, the capacitor 240 of memory cell 205 may output a signal (e.g., discharge a charge) to its corresponding digit line 215. The signal may cause a voltage of the digit line 215 to change. The sense component 250 may be configured to compare the signal received from the memory cell 205 across the digit line 215 to a reference signal 255 (e.g., a reference voltage). The sense component 250 may determine the stored state of the memory cell 205 based on the comparison. For example, in binary-signaling, if digit line 215 has a higher voltage than the reference signal 255, the sense component 250 may determine that the stored state of memory cell 205 is a logic 1, and, if the digit line 215 has a lower voltage than the reference signal 255, the sense component 250 may determine that the stored state of the memory cell 205 is a logic 0.

The sense component 250 may include various transistors or amplifiers to detect and amplify a difference in one or more signals. The detected logic state of memory cell 205 may be output through column decoder 230. In some cases, the sense component 250 may be part of another component (e.g., a column decoder 230, row decoder 225). In some cases, the sense component 250 may be in electronic communication with the row decoder 225, the column decoder 230, the plate driver 235, other components, or any combination thereof.

The local memory controller 265 may control the operation of memory cells 205 through the various components (e.g., row decoder 225, column decoder 230, plate driver 235, and sense component 250). The local memory controller 265 may be an example of the local memory controller 165 described with reference to FIG. 1. In some cases, one or more of the row decoder 225, column decoder 230, and plate driver 235, and sense component 250 may be co-located with the local memory controller 265. The local memory controller 265 may be configured to receive one or more commands and/or data from an external memory controller 105 (or a device memory controller 155 described with reference to FIG. 1), translate the commands and/or data into information that can be used by the memory die 200, perform one or more operations on the memory die 200, and communicate data from the memory die 200 to the external memory controller 105 (or the device memory controller 155) in response to performing the one or more operations.

The local memory controller 260 may send content to, and receive content from, external devices via transmissions lines. For example, the local memory controller 260 may receive content via receiver 270. As described herein, the local memory controller 260 may able to configure one or more cancelation circuits of the receiver 270. In some cases, the local memory controller 260 may transmit information to an external device regarding crosstalk experienced based on or by one or more signals sent from the external device to the local memory controller 260. In such cases, the local memory controller 260 may configure the cancelation circuits according to information received from the external device. Alternatively, the local memory controller 260 may configure the one or more cancelation circuits autonomously. Because the cancelation circuit may modify the reference signals in a manner that compensates for the impact of the crosstalk, the victim signal may be more reliably received at the receiver 270 (e.g., received with reduced error rates).

The local memory controller 265 may generate row, column, and/or plate line address signals to activate the target word line 210, the target digit line 215, and the target plate line 220. The local memory controller 265 may also generate and control various voltages or currents used during the operation of the memory die 200. In general, the amplitude, shape, or duration of an applied voltage or current discussed herein may be adjusted or varied and may be different for the various operations discussed in operating the memory die 200.

In some cases, the local memory controller 265 may be configured to perform a precharge operation on the memory die 200. A precharge operation may comprise precharging one or more components and/or access lines of the memory die 200 to one or more voltage levels. In some instances, the memory cell 205 and/or portions of the memory die 200 may be precharged between different access operations. In some instances, the digit line 215 and/or other components may be precharged before a read operation.

In some cases, the local memory controller 265 may be configured to perform a write operation (e.g., a programming operation) on one or more memory cells 205 of the memory die 200. During a write operation, a memory cell 205 of the memory die 200 may be programmed to store a desired logic state. In some cases, a plurality of memory cells 205 may be programmed during a single write operation. The local memory controller 265 may identify a target memory cell 205 on which to perform the write operation. The local memory controller 265 may identify a target word line 210, a target digit line 215, and/or a target plate line 220 in electronic communication with the target memory cell 205 (e.g., the address of the target memory cell 205). The local memory controller 265 may activate the target word line 210, the target digit line 215, and/or the target plate line 220 (e.g., applying a voltage to the word line 210, digit line 215, or the plate line 220), to access the target memory cell 205. The local memory controller 265 may apply a specific signal (e.g., voltage) to the digit line 215 and a specific signal (e.g., voltage) to the plate line 220 during the write operation to store a specific state in the capacitor 240 of the memory cell 205, the specific state being indicative of a desired logic state.

In some cases, the local memory controller 265 may be configured to perform a read operation (e.g., a sense operation) on one or more memory cells 205 of the memory die 200. During a read operation, the logic state stored in a memory cell 205 of the memory die 200 may be determined. In some cases, a plurality of memory cells 205 may be sensed during a single read operation. The local memory controller 265 may identify a target memory cell 205 on which to perform the read operation. The local memory controller 265 may identify a target word line 210, a target digit line 215, and/or a target plate line 220 in electronic communication with the target memory cell 205 (e.g., the address of the target memory cell 205). The local memory controller 265 may activate the target word line 210, the target digit line 215, and/or a target plate line 220 (e.g., applying a voltage to the word line 210, the digit line 215, or the plate line 220), to access the target memory cell 205. The target memory cell 205 may transfer a signal to the sense component 250 in response to biasing the access lines. The sense component 250 may amplify the signal. The local memory controller 265 may fire the sense component 250 (e.g., latch the sense component) and thereby compare the signal received from the memory cell 205 to the reference signal 255. Based on that comparison, the sense component 250 may determine a logic state that is stored on the memory cell 205. The local memory controller 265 may communicate the logic state stored on the memory cell 205 to the external memory controller 105 (or the device memory controller) as part of the read operation.

In some memory architectures, accessing the memory cell 205 may degrade or destroy the logic state stored in a memory cell 205. For example, a read operation performed on a ferroelectric memory cell may destroy the logic state stored in the ferroelectric capacitor. In another example, a read operation performed in DRAM architectures may partially or completely discharge the capacitor of the target memory cell. The local memory controller 265 may perform a re-write operation or a refresh operation to return the memory cell to its original logic state. The local memory controller 265 may re-write the logic state to the target memory cell after a read operation. In some cases, the re-write operation may be considered part of the read operation. Additionally, activating a single access line, such as a word line 210, may disturb the state stored in some memory cells in electronic communication with that access line. Thus, a re-write operation or refresh operation may be performed on one or more memory cells that may not have been accessed.

Figure 3:
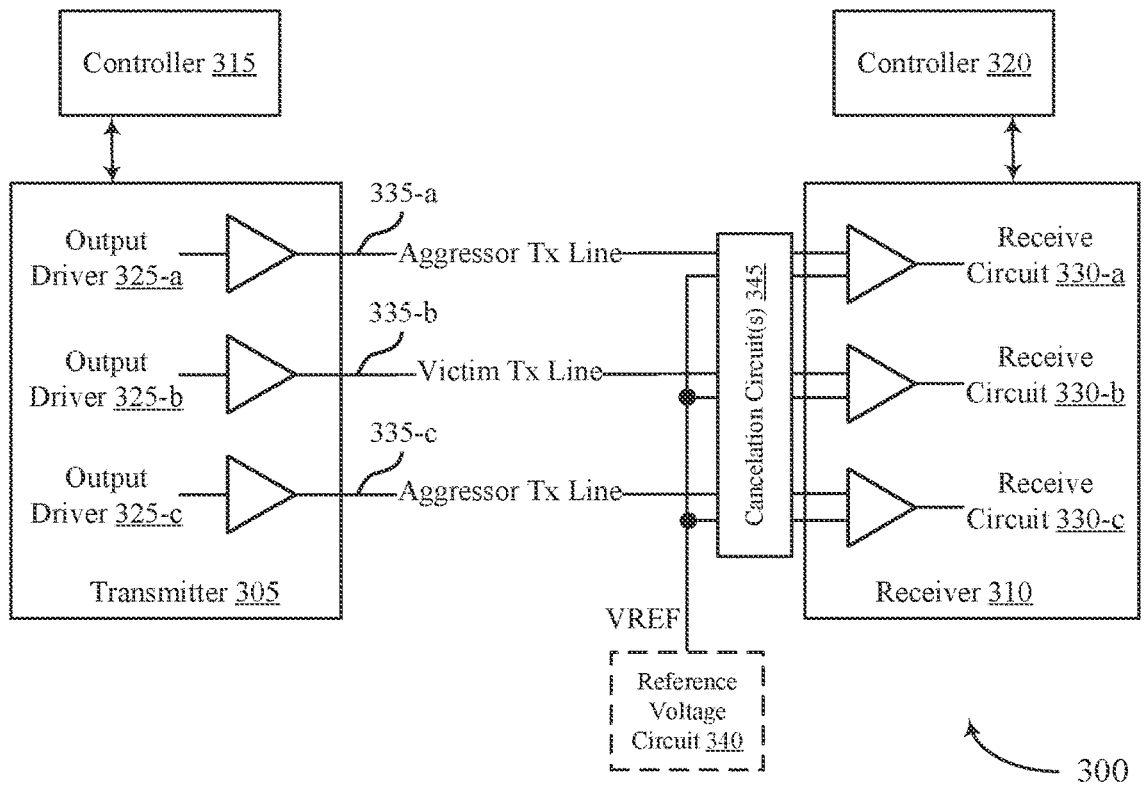
FIG. 3 illustrates an example of a system that supports receive-side crosstalk cancelation in accordance with various examples as disclosed herein.

FIG. 3 illustrates an example of a system 300 that supports receive-side crosstalk cancelation in accordance with various examples as disclosed herein. System 300 may be an example of a system 100 described with reference to FIG. 1. System 300 may include a transmitter 305 and a receiver 310. The transmitter 305 may be in electronic communication with or coupled with a controller 315, which may direct or control aspects of the transmitter's operation. The controller 315 may be an example of an external memory controller 105 (also referred to as a host or host device), a processor 120 (e.g., a GPU, a GPGPU, a CPU), a local memory controller 165, or a memory device 110 as described with reference to FIG. 1. In some cases, the transmitter 305 may be included in or coupled with a host device. The receiver 310 may include or be coupled with a controller 320, which may direct or control aspects of the receiver's operation.

Controller 320 may be an example of a device memory controller 155 or a local memory controller 165 described with reference to FIG., or a local memory controller 260 described with reference to FIG. 2.1. So in some examples, receiver 310 is coupled to a memory array or memory die (e.g., memory die 200) via controller 320. For instance, receiver 310 may be an example of a receiver 270 described with reference to FIG. 2.

The transmitter 305 may include output drivers 325, which may drive (e.g., output) electrical signals on transmission lines 335. For example, output driver 325-*a* may drive a first data signal on first transmission line 335-*b*, output driver 325-*b* may drive a second data signal on second transmission line 335-*a*, and output driver 325-*c* may drive a third data signal on third transmission line 335-*c*. Although referred to as data signals as one example, the signals transmitted over transmission lines 335 may convey control information or user content and in some examples may or may not include data (e.g., other types of signals can be transmitted). Regardless of the type of content, the signals may be transmitted concurrently (e.g., in parallel, transmitted so that they at least partially overlap in time).

Transmitting multiple data signals at the same time may result in crosstalk between the signals (e.g., when transmission lines 335 are closely-spaced). For instance, when transmitter 305 drives data signals concurrently on transmission line 335-*a*, transmission line 335-*b*, and transmission line 335-*c*, the data signal on transmission line 335-*a* and the data signal on transmission line 335-*c* may interfere with the data signal on transmission line 335-*b*. Such interference, which arises from capacitive coupling or inductive coupling between the transmission lines, may be referred to herein as crosstalk or cross coupling.

When considered from the perspective of transmission line 335-*b*, transmission line 335-*a* and transmission line 335-*c* are said to be aggressor transmission lines (and their signals are referred to as aggressor signals) and transmission line 335-*b* is said to be a victim line (and its signal is referred to as a victim signal). Although the signal on transmission line 335-*b* also interferes with the signals on transmission lines 335-*a* and 335-*c*, for ease of illustration crosstalk will be discussed from the perspective of a single transmission line 335. However, the cancelation techniques described herein can be applied or implemented for at least some if not each transmission line 335, such as each transmission line that experiences crosstalk. The techniques described herein may also be used to compensate for any quantity (e.g., any quantity, one to N) of aggressor signals or aggressor transmission lines.

The transmission lines 335 may each be included in a channel 115, such as a data channel 190 as described with reference to FIG. 1. Transmission lines 335 that are within a threshold distance of a victim transmission line 335 or otherwise cause crosstalk on another line may be considered aggressor transmission lines 335. Although described with reference to two immediately adjacent aggressor transmission lines, the techniques described herein are applicable to any quantity of aggressor transmission lines in any orientation or configuration.

As shown in system 300, transmission lines 335 may originate at one component (e.g., transmitter 305) and terminate at another component (e.g., receiver 310) which may or may not be within the same device. The origination and termination points may be referred to as nodes (pins, pads, terminals, transmission line interfaces, interface components, or connection points, etc.) and may provide an interface between the transmission lines 335 and the transmitting and receiving devices. For example, the nodes may include a conductive material that is capable of transferring charge to and from the transmissions lines 335 and transmitter 305 (or receiver 310). Thus, the nodes may connect (e.g., physically and electrically) the transmission lines 335 to the greater electrical networks of the transmitter 305 and receiver 310.

The transmission lines 335 may be differential transmission lines or single-ended transmission lines. Thus, transmission lines 335 may be used to implement differential signaling or single-ended signaling. In differential signaling, two differential transmission lines are used to convey a single electrical signal from a transmitter to a receiver. One transmission line may carry the signal and the other transmission line may carry an inverted version of the signal. A receiver may extract information from the signals by detecting the potential difference between the inverted and non-inverted signals. In single-ended signaling, a single-ended transmission line is used to convey a single electrical signal from a transmitter to a receiver. In this case, a receiver may extract information from the signal, for example, by detecting the potential difference between the signal and a reference signal (e.g., reference signal VREF, which may be generated by a reference voltage circuit 340). Thus, a data signal conveyed via single ended transmission techniques may be received by a receiver, such as a differential receiver, that compares the data signal to the reference signal, amplifies the difference, and outputs an indication of the data.

As described above, crosstalk may arise when multiple signals are transmitted on different transmission lines at the same time (e.g., when multiple signals overlap in the time domain). Such crosstalk may impact the integrity of effected signals by increasing or decreasing the voltage of those signals. For example, an alternating current (AC) crosstalk component may be added to a direct current (DC) data signal. If the crosstalk changes the signal's voltage beyond a threshold amount (e.g., so as to be outside a data eye or symbol margin for an intended symbol), the data conveyed by the signal may be corrupted or lost.

According to the techniques described herein, however, a receiver may compensate for crosstalk contributions to a data signal by adding crosstalk contributions (e.g., equivalent crosstalk contributions) to the corresponding reference signal. The addition of the crosstalk contributions to the reference signal may be accomplished via a cancelation circuit 345 that may be coupled with the victim receive circuit and the aggressor receive circuit. Because single ended signaling may be detected based on the difference between the data signal and the reference signal, matching reference signal crosstalk contributions to data signal crosstalk contributions preserves the relationship between the two signals.

The crosstalk contributions introduced by the cancelation circuit 345 may be a function of the electrical characteristics (e.g., capacitance, resistance, inductance) of the cancelation circuit 345. These characteristics may be dynamically adjusted by configuring the cancelation circuit on the fly. Alternatively, these characteristics may be set when the cancelation circuit 345 is configured during manufacturing.

Figure 4:
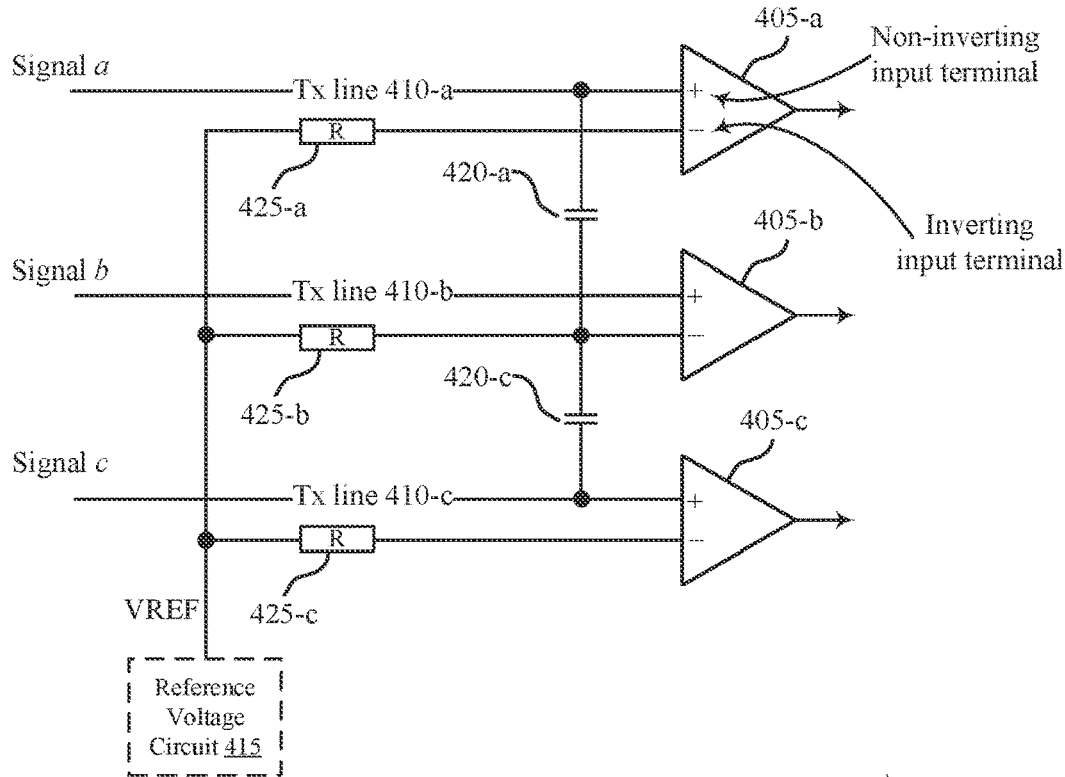
FIG. 4 illustrates an example of a memory device that supports receive-side crosstalk cancelation in accordance with various examples as disclosed herein.

FIG. 4 illustrates an example of a memory device 400 that supports receive-side crosstalk cancelation in accordance with various examples as disclosed herein. Memory device 400 may be part of or coupled with a memory device 110 as described with reference to FIG. 1. Thus, memory device 400 may receive content (e.g., data and/or control information) for one or more memory arrays or memory dies with which the memory device 400 is coupled. Memory device 400 may include a receiver (such as receiver 310 described with reference to FIG. 3) and a cancelation circuit (such as cancelation circuit 345 described with reference to FIG. 3).

Memory device 400 may be part of a system 300 as described with reference to FIG. 3. Thus, memory device 400 may include receive circuits 405-*a*, 405-*b*, and 405-*c*, which may be examples of receive circuits 330 described with reference to FIG. 3. The receive circuits 405 may include—or be—operational amplifiers (op amps). In some cases, the receive circuits 405 may be differential receivers that are coupled with single-ended transmission lines (e.g., transmission lines 410). Although described with three receive circuits 405, the cancelation techniques described herein may be implemented using any quantity of receive circuits 405. Receive circuits 405 may also be referred to as receivers.

Each receive circuit 405 may include two or more input terminals, such as a first input terminal, such as a first inverting terminal (or "negative" terminal), and a second input terminal, such as a non-inverting (or "positive") terminal. The non-inverting terminal may also be referred to as a terminal. The one or more non-inverting input terminals may be coupled with transmission lines that convey data signals from respective transmitters and the one or more inverting input terminals may be coupled with transmission lines that convey a reference signal (e.g., VREF, which may be generated by a reference voltage circuit 415). A receive circuit 405 may compare a data signal to the reference signal to determine the content of the data signal. For example, in single-ended signaling, a receive circuit 405 may compare the voltage of the data signal to the voltage of the reference signal, which may be a value between (e.g., centered between) the value for a logic 0 and the value for a logic 1. The reference voltage may be present on a node that is configured to maintain the reference voltage at a certain level.

As noted, crosstalk may occur when multiple signals are transmitted (e.g., by a host device) concurrently over the transmission lines 410. For example, signal b may be affected (e.g., via capacitive and/or inductive coupling) by signal a and signal c. The nature of the crosstalk may be defined by characteristics such as its time constant (also referred to as its RC or LC constant) and its severity (also referred to as its level), among other factors. In some examples, the level of crosstalk may be application and circuit-specific and may be expressed in terms of voltage.

In some examples, when the crosstalk is capacitive, the time constant may be a function of the resistance of the victim transmission line (e.g., the resistance of transmission line 410-b) and the parasitic capacitance between the victim transmission line and the aggressor transmission line. In other examples, when the crosstalk is inductive, the time constant may be a function of the parasitic inductance between the victim transmission line and the aggressor transmission line and the resistance of the victim transmission line (e.g., the resistance of transmission line 410-b). The frequency of a crosstalk signal may, in some cases, be the inverse of the time constant for the crosstalk.

A passive network, such as a cancelation circuit 345 described with reference to FIG. 3, may be used to mitigate the effects of crosstalk between transmission lines. Because crosstalk affects the data signal entering the non-inverting input terminal of the victim receive circuit 405-b, the cancelation circuit may be configured to produce the same crosstalk at the non-inverting input terminal of the victim receive circuit 405-b. For example, the cancelation circuit may ensure that crosstalk contributions made to signal b are accounted for with respect to (e.g., also made to) the corresponding reference signal VREF before it reaches receive circuit 405-b.

One example of such a cancelation circuit includes capacitors (C) 420 and resistors (R) 425. This type of cancelation circuit (e.g., an RC cancelation circuit) may be appropriate when the crosstalk in the system arises from capacitive coupling. In an RC cancelation circuit, the capacitors may be coupled with (e.g., in electronic communication with) the non-inverting input terminal(s) of the aggressor receive circuit(s) (e.g., receive circuits 405-a and 405-c) and the inverting terminal of the victim receive circuit (e.g., receive circuit 405-b). For example, the cancelation circuit may include capacitor 420-a and capacitor 420-c. Capacitor 420-a may provide cancelation for crosstalk caused by or related to transmission line 410-a and capacitor 420-c may provide cancelation for crosstalk caused by or related to transmission line 410-c.

Capacitor 420-a may be coupled with the non-inverting input terminal of receive circuit 405-a and the inverting input terminal of receive circuit 405-b. Similarly, capacitor 420-c may be coupled with the non-inverting input terminal of receive circuit 405-c and the inverting input terminal of receive circuit 405-b. Due to their reactive natures, the coupling capacitors may act as high-pass filters that allow the high frequencies (e.g., AC components) of signals to pass while blocking the low frequencies (e.g., DC components) of the signals. If the capacitor values are similar to the parasitic capacitance between the transmission lines, the signals passed through the cancelation circuit will match those added to the data signals. Thus, the voltage difference between the data signals and the corresponding reference signals will be maintained, regardless of the crosstalk introduced during propagation.

The resistors 425 of an RC cancelation circuit may be coupled with the terminals (e.g., inverting input terminals) of the receive circuits and the reference voltage VREF (e.g., a reference voltage circuit 415 or a node with the reference voltage). For example, resistor 425-a may be coupled with the inverting input terminal of receive circuit 405-a, resistor 425-b may be coupled with the inverting input terminal of receive circuit 405-b, and resistor 425-c may be coupled with the inverting input terminal of receive circuit 405-c. The values of the resistors 425 may, in some examples, determine the level of crosstalk cancelation.

Figure 5:
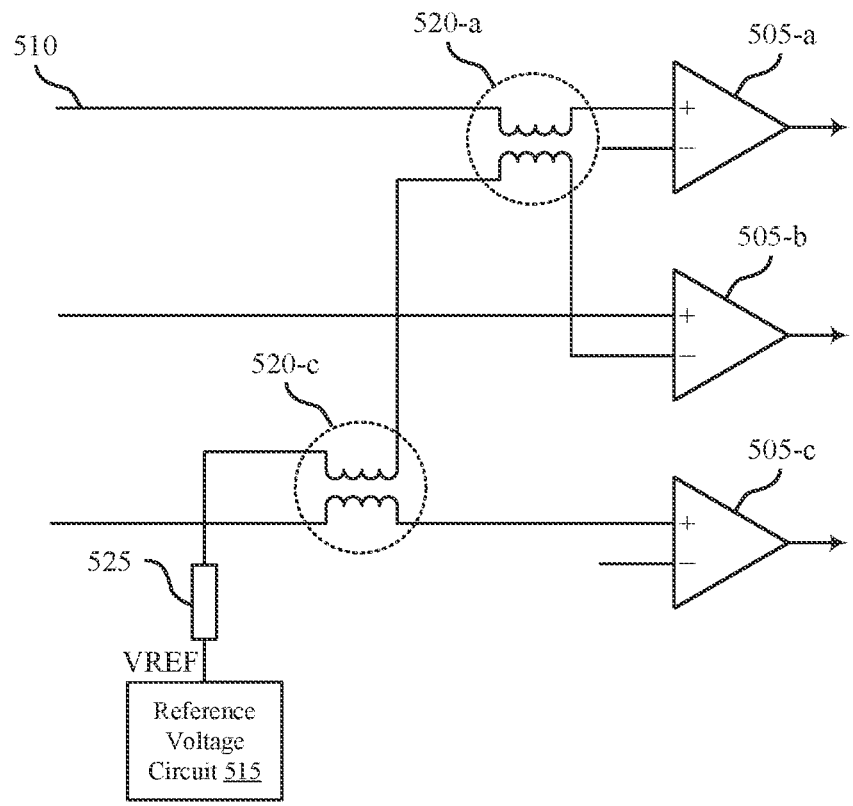
FIG. 5 illustrates an example of a memory device that supports receive-side crosstalk cancelation in accordance with various examples as disclosed herein.

Although described with reference to an RC circuit, the cancelation techniques described herein can be implemented using various other circuits, for examples using an LC circuit an example of which is shown in FIG. 5.

FIG. 5 illustrates an example of a memory device 500 that supports receive-side crosstalk cancelation in accordance with various examples as disclosed herein. Memory device 500 may be part of a system 300 as described with reference to FIG. 3. Thus, memory device 500 may include receive circuits 505-a, 505-b, and 505-c, which may be examples of receive circuits 330 described with reference to FIG. 3. For example, receive circuits 505 may be part of a receiver 310 as described with reference to FIG. 3. Thus, memory device 500 may receive content for a memory array with which the memory device 500 is coupled. In some cases, memory device 500 may also be coupled with a memory controller. Memory device 500 may include reference voltage circuit 515, which may be an example of a reference voltage circuit 340 described with reference to FIG. 3. Memory device 500 may include an example of an LC cancelation circuit.

The LC circuit may include inductors (L) and resistors (R). This type of cancelation circuit may be appropriate when the crosstalk in the system arises from inductive coupling between transmission lines 510. In an LC cancelation circuit, the inductors may take the form of components, such as transformers, that may be coupled with (e.g., in electronic communication with) one or more terminals, such as the non-inverting input terminal(s), of the aggressor receive circuit(s) (e.g., receive circuits 505-a and 505-c) and one or more terminals, such as the inverting terminal, of the victim receive circuit (e.g., receive circuit 505-b).

For example, the LC cancelation circuit may include transformer 520-a and transformer 520-c. Transformer 520-a may be coupled with the non-inverting input terminal of receive circuit 505-a and the inverting input terminal of receive circuit 505-b. Similarly, transformer 520-c may be coupled with the non-inverting input terminal of receive circuit 505-c and the inverting input terminal of receive circuit 505-b. Like the coupling capacitors, the transformers may act as high-pass filters that allow the high frequencies (e.g., AC components) of signals to pass while blocking the low frequencies (e.g., DC components) of the signals. If the transformer values are similar to the parasitic inductance between the transmission lines 510, the signals passed through the LC cancelation circuit will match those added to the data signals. Thus, the voltage difference between the data signals and the corresponding reference signals will be maintained, regardless of the crosstalk introduced during propagation.

Like the resistors of the RC cancelation circuit described with reference to FIG. 4, the resistor(s) 525 of the LC cancelation circuit may be coupled with terminals, such as the inverting input terminals, of the receive circuits and the reference voltage VREF (e.g., a reference voltage circuit 515 or a node with the reference voltage). The value(s) of the resistor(s) 525 may, in some examples, determine the level of crosstalk cancelation provided by the LC cancelation circuit.

Although described with reference to capacitors, any of the cancelation circuit configurations or operation techniques described herein may be implemented using inductors in place of, or in addition to, capacitors, among other example components or combinations of components.

Figure 6:
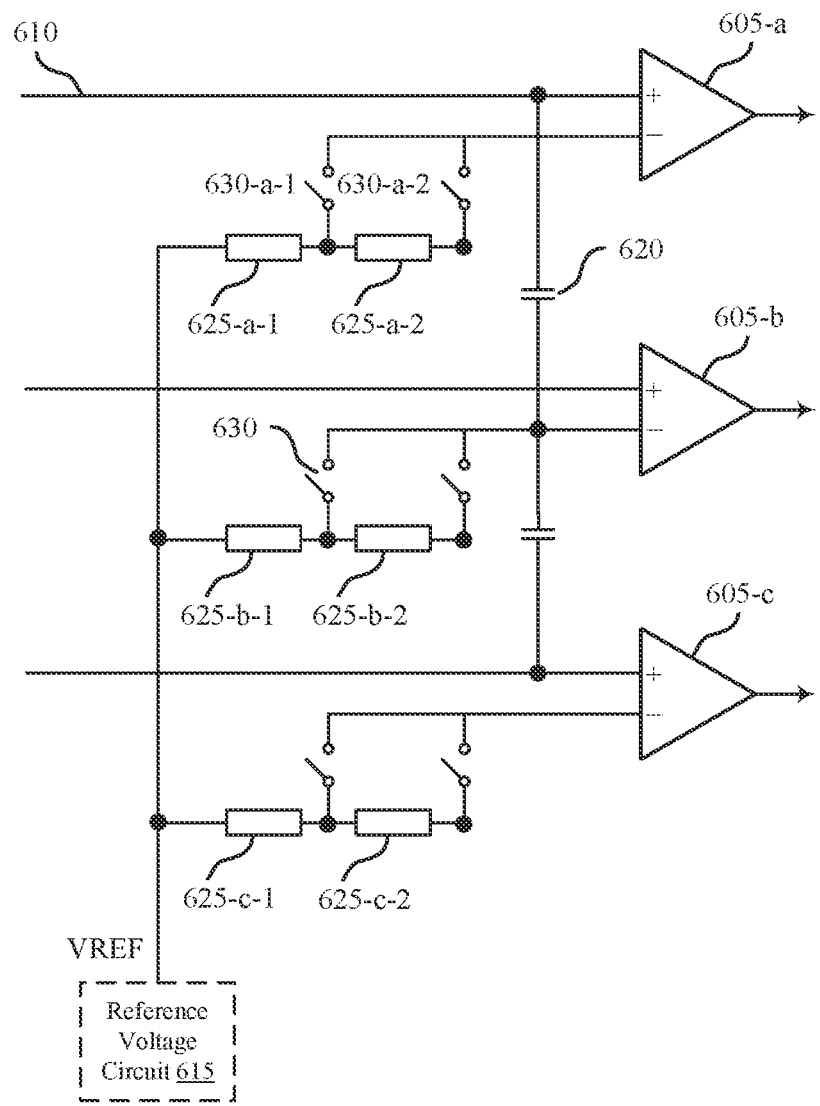
FIG. 6 illustrates an example of a memory device that supports receive-side crosstalk cancelation in accordance with examples as disclosed herein.

FIG. 6 illustrates an example of a memory device 600 that supports receive-side crosstalk cancelation in accordance with various examples as disclosed herein. Memory device 600 may include a cancelation circuit that provides configurable levels of cancelation. Memory device 600 may include receive circuits 605, transmission lines 610, reference voltage circuit 615, capacitors 620, and resistors 625. Resistors 625 may also be referred to as resistive components or elements. Although shown with capacitors (e.g., as an RC circuit), the cancelation circuit of memory device 600 may be implemented with inductors (e.g., as an LC circuit). The receive circuits 605 may be part of a receiver 270 or 310 as described with reference to FIGS. 2 and 3, respectively. Thus, the receive circuits 605 may receive content (e.g., data or control content) for one or more memory arrays with which the memory device 600 is coupled. In some cases, the memory device 600 may include or be coupled with a controller that configures the cancelation circuit.

Each receive circuit 605 may be coupled with (e.g., in electronic communication with) a set of resistors 625. For example, the inverting input terminal of each receive circuit 605 may be coupled with two or more resistors 625. Thus, the inverting input terminal of receive circuit 605-$a$ may be coupled with resistors 625-$a$-1 and 625-$a$-2, the inverting input terminal of receive circuit 605-$b$ may be coupled with resistors 625-$b$-1 and 625-$b$-2, and the inverting input terminal of receive circuit 605-$c$ may be coupled with resistors 625-$c$-1 and 625-$c$-2. In addition to being coupled with the inverting input terminals, the resistors 625 may also be coupled with a node that supplies the reference voltage VREF (e.g., as generated by reference voltage circuit 615). Although shown configured in series (e.g., in a voltage divider configuration), in some implementations the resistors 625 may alternatively be configured in parallel.

In some cases, the receive circuits 605 may be coupled with the resistors via one or more intervening components, such as switching components 630 (e.g., transistors, diodes, multiplexors, etc.). A switching component may also be referred to as a selection component. The switching components 630 may electrically couple and decouple the inverting input terminals and the resistors 625 (e.g., based on a level of voltage applied to the switching components). By selecting (e.g., activating) one of the switching components 630, the memory device 600 may adjust the cancelation level provided by the cancelation circuit. This is because the cancelation level is proportional to the level of resistance in the cancelation circuit. So selecting switching component 630-$a$-1 may provide a first level of cancelation (e.g., 50%) and selecting switching component 630-$a$-2 may provide a second level of cancelation (e.g., 100%), Although the resistance (and thus cancelation level) provided by the cancelation circuit may be autonomously selected by the memory device 600 (e.g., while it is operating), in some cases the resistance may be selected during the fabrication of the memory device 600. In these cases, a single switching component 630 per set of resistors may be enabled. In another example, the cancelation circuit may feature trace interruptions in place of the switching components 630 (e.g., each switching component may be replaced with interruptions in the material forming the transmission lines). In these cases, the cancelation level provided for each aggressor may be set by forming metal elements, such as bridges (e.g., filling in the gaps with conductive materials), to the desired nodes. Thus, the cancelation level provided by a receive-side cancelation circuit may be dynamically selected (e.g., during operation) or statically configured (e.g., during fabrication).

Figure 7:
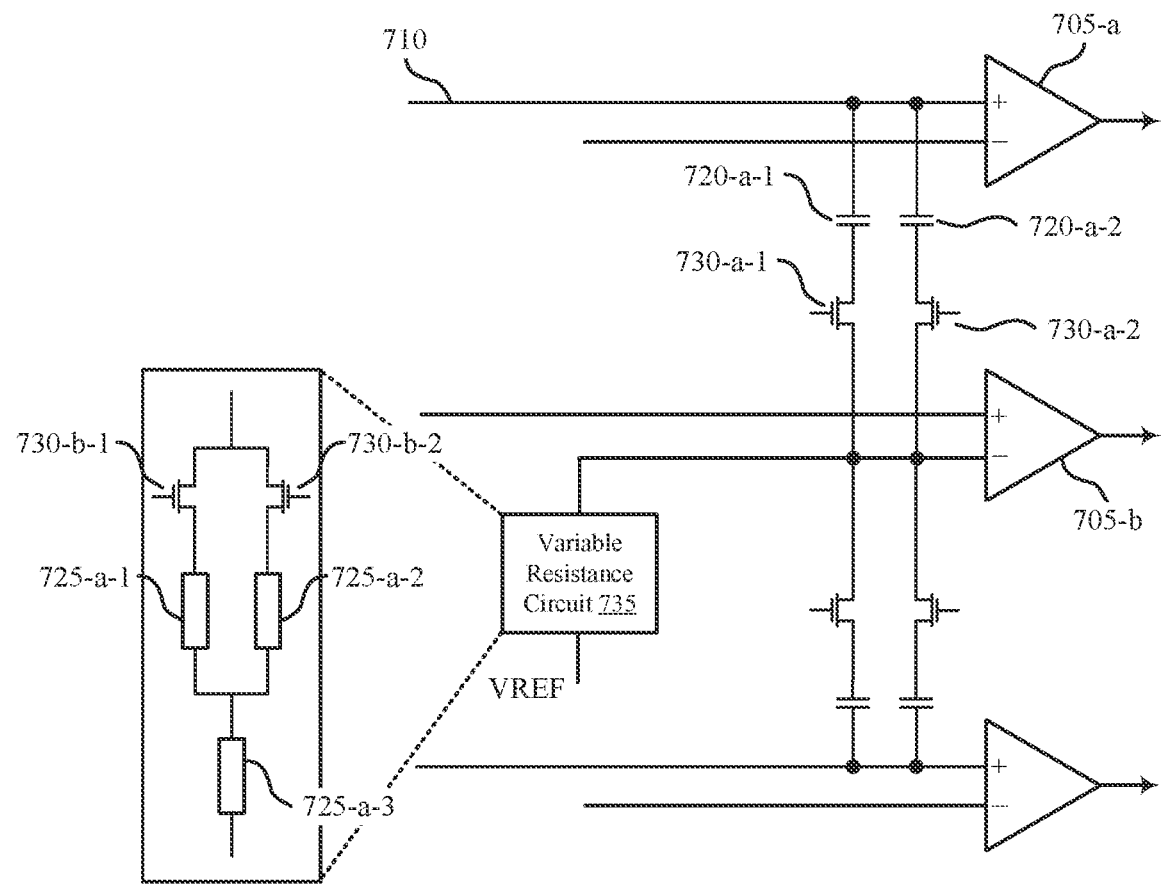
FIG. 7 illustrates an example of a memory device that supports receive-side crosstalk cancelation in accordance with various examples as disclosed herein.

FIG. 7 illustrates an example of a memory device 700 that supports receive-side crosstalk cancelation in accordance with various examples as disclosed herein. Memory device 700 may include receive circuits 705, transmission lines 710, capacitors 720, and resistors 725, which may be examples of respective components described with reference to FIGS. 4-6. In some cases, memory device 700 may also include a reference voltage circuit as described with reference to FIGS. 3-5. Memory device 700 may include a cancelation circuit that provides configurable levels of cancelation as well as a configurable time constant (e.g., frequency or bandwidth of cancelation). Thus, the cancelation circuit of memory device 700 may provide two degrees of freedom. Although shown with capacitors (e.g., as an RC circuit), the cancelation circuit of memory device 600 may be implemented using inductors (e.g., as an LC circuit).

The receive circuits 705 may be part of a receiver 270 or 310 as described with reference to FIGS. 2 and 3, respectively. Thus, the receive circuits 705 may receive content (e.g., data or control content) for one or more memory arrays with which the memory device 700 is coupled. In some cases, the memory device 700 may include or be coupled with a controller that configures the cancelation circuit.

The bandwidth (or "cutoff frequency" $f_c$) of cancelation may be selected by enabling one or more capacitors 720 while disabling the other(s). For example, capacitor 720-$a$-1 may have a first value that is different than the value of capacitor 720-$a$-2. Because the bandwidth of cancelation may be a function of capacitance (e.g., $f_c=1/2\pi RC$), enabling capacitor 720-$a$-1 may provide a first bandwidth of cancelation and enabling capacitor 720-$a$-2 may provide a second bandwidth of cancelation.

For example, if the value of capacitor 720-$a$-1 is half the value of capacitor 720-$a$-2, the bandwidth (e.g., cutoff frequency $f_{c1}$) of capacitor 720-$a$-1 may be twice that of capacitor 720-$a$-2 (e.g., cutoff frequency $f_{c2}$). Thus, capacitor 720-$a$-1 may block crosstalk signals with frequencies lower than its cutoff frequency $f_{c1}$ while passing frequencies that are higher than its cutoff frequency $f_{c1}$. And capacitor 720-$a$-2 may block crosstalk signals with frequencies lower than its cutoff frequency $f_{c2}$ while passing frequencies that are higher than its cutoff frequency $f_{c2}$. Additional bandwidths (e.g., cutoff frequencies) can be provided by enabling neither or both of the capacitors 720.

Because the capacitors 720 may be positioned in parallel, one or both may be selected by establishing a conductive path between the desired capacitor and the inverting input terminal of the victim receive circuit (e.g., receive circuit 705-$b$). The conductive path(s) may be established by activating (e.g., enabling) one or more intervening components, such as switching components 730. For example, activating switching component 730-$a$-1 may provide a conductive path between the non-inverting input terminal of receive circuit 705-$a$ and the inverting input terminal of receive circuit 705-$b$. And activating switching component 730-$a$-2 may provide a conductive path between the non-inverting input terminal of receive circuit 705-$a$ and the inverting input terminal of receive circuit 705-$b$. So by activating the appropriate switching components, memory device 700 may dynamically select the bandwidth of crosstalk cancelation provided by the cancelation circuit.

Although switching components 730 can be used to select different cancelation bandwidths, the available bandwidths may be limited in quantity (e.g., limited to $2^n$ bandwidths, where n is the quantity of capacitors). In an alternative configuration, the cancelation circuit can deliver a wider range of cancelation bandwidths by using one or more voltage-controlled capacitors (also referred to as varactor diodes or varicap diodes). A voltage-controlled capacitor may be a three-terminal component with a capacitance between two terminals that changes based on the voltage applied to its third (e.g., control) terminal, because the capacitance is responsive to an analog voltage, a voltage-controlled capacitor is able to provide a wide range of capacitances, which may enable the cancelation circuit to finely tune its cancelation. The use of voltage-controlled capacitors may also reduce the footprint of the cancelation circuit by removing the need for switching components 730-a.

In addition to providing a configurable cancelation bandwidth (e.g., by providing configurable capacitance), the cancelation circuit may also provide a configurable cancelation level (e.g., by providing a configurable resistance). For example, the cancelation circuit may include one or more variable resistance circuits 735. The variable resistance circuit 735 may be coupled with the inverting input terminal of victim receive circuit 705-b. In some cases, the inverting input terminals of aggressor receive circuits 705-a and 705-c may also be coupled with the variable resistance circuit 735; or the aggressor receive circuits may be coupled with their own respective variable resistance circuits.

The variable resistance circuit 735 may include resistors 725 and switching components 730. Resistor 725-a-1 and resistor 725-a-2 may be in parallel and coupled with resistor 725-a-3. Additionally, resistor 725-a-1 may be in series with switching component 730-b-1, and resistor 725-a-2 may be in series with switching component 730-b-2. The resistance encountered by the reference voltage VREF, and provided by the cancelation circuit, may be varied by activating one or both of switching components 730-b. For example, a first level of resistance may be provided by activating switching component 730-b-1 and deactivating switching component 730-b-2. A second level of resistance may be provided by activating switching component 730-b-2 and deactivating switching component 730-b-1. And a third level of resistance may be provided by activating both switching component 730-b-1 and switching component 730-b-2. Thus, variable resistance circuit 735 may provide configurable resistances for the cancelation circuit.

Figure 8:
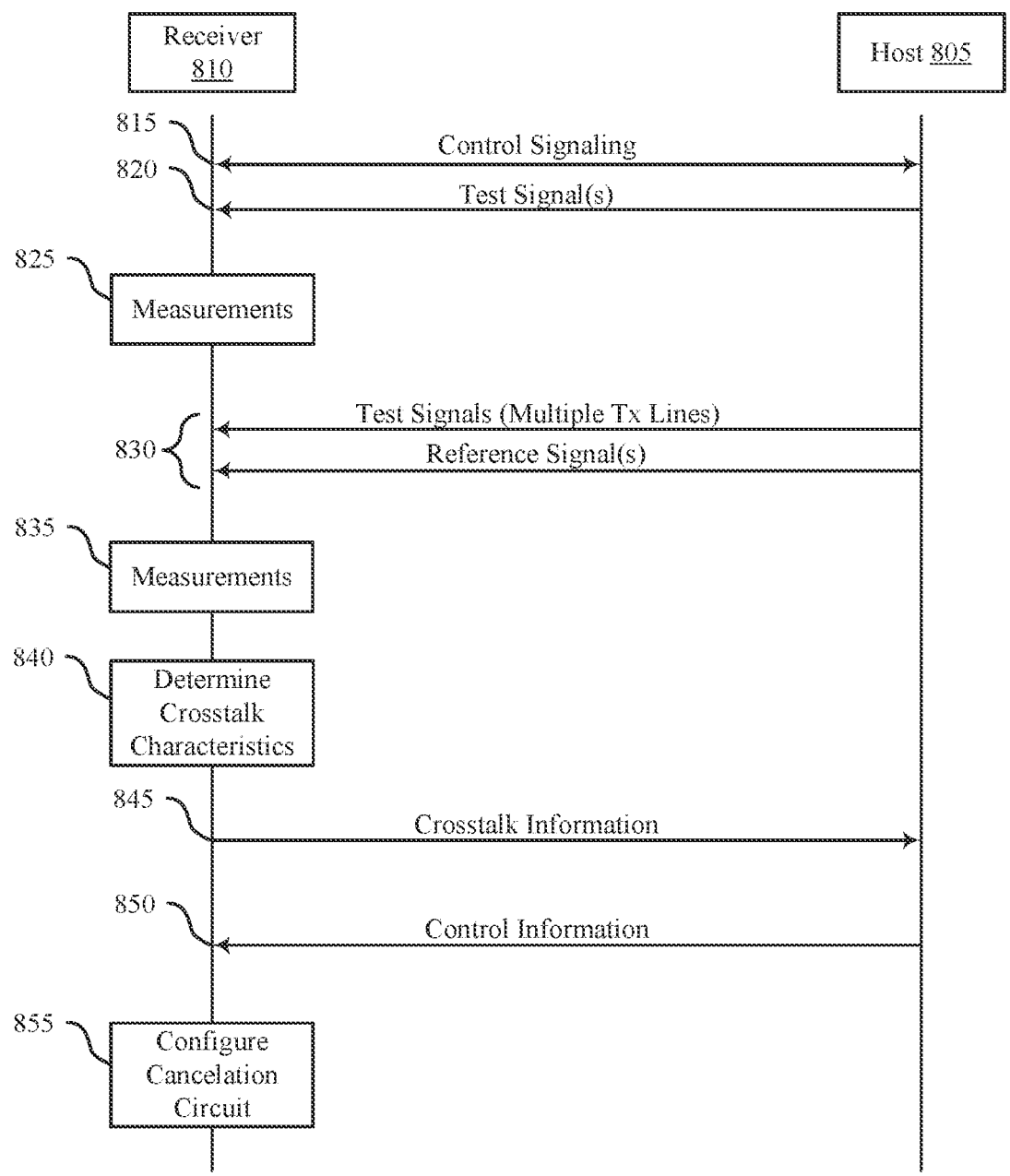
FIG. 8 illustrates an example of a process flow that supports receive-side crosstalk cancelation in accordance with various examples as disclosed herein.

FIG. 8 illustrates an example of a process flow 800 that supports receive-side crosstalk cancelation in accordance with various examples as disclosed herein. Aspects of process flow 800 made be performed by a host 805 and a receiver 810. The host 805 may be an example of an external memory controller 105 described with reference to FIG. 1, and the receiver 810 may be an example of a receiver 310 described with reference to FIG. 3. The receiver 810 may include one or more of the cancelation circuits described with reference to FIGS. 3-7. The process flow 800 may include aspects of a collaborative configuration process for the cancelation circuit(s). Although described with reference to two signals, the configuration techniques of process flow 800 may be implemented for any quantity of signals.

At 815, the receiver 810 and the host 805 may exchange control signaling that sets up and initiates the configuration process. At 820, the host 805 may transmit, and the receiver 810 may receive, one or more test signals. For example, the host 805 may transmit a first test signal to the receiver 810 over a first transmission line. The first test signal may be sent independent of other signals (e.g., the first test signal may be the sole signal sent during a period of time x). Thus, the first test signal may serve as a baseline signal that experiences no crosstalk. Upon receiving the first test signal (and a corresponding reference signal), the receiver 810 may, at 825, perform measurements on the first test signal. The receiver 825 may store the measurement results for later reference and/or transmit the measurement results to the host 805.

At 830, the receiver 810 may receive multiple test signals concurrently over different transmission lines. For example, the receiver 810 may receive another version of first test signal over the first transmission line and a second test signal over a second transmission line. The reception of the test signals may overlap at least partially in time and the data signals may be modulated with a multi-level modulation scheme, such as PAM2, PAM4, etc. Also at 830, or within a threshold amount of time before or after, the receiver 810 may receiver one or more reference signals. The reference signals may be DC voltages with values that are between the voltage values of the data signals that correspond to logic 0 and logic 1. The reference signal(s) may be received over transmission lines that are interspersed with one or more resistive elements, such as resistors.

At 835, the receiver 810 may perform measurements on the first test signal. The measurements may be the same or similar to those performed at 825. At 840, the receiver 810 may determine the characteristics of crosstalk caused by the second data signal and experienced by the first data signal. The receiver 810 may determine the crosstalk characteristics based on the measurements of the test signals. In some examples, the crosstalk characteristics include the frequency of the crosstalk contributions (e.g., the frequency of the crosstalk signal) and/or the severity of the crosstalk (e.g., the voltage or current level of the crosstalk signal). In some cases, the results of the measurements at 835 may be transmitted to the host 805 for analytics at the host 805.

At 845, the receiver 810 may transmit information about the crosstalk characteristics to the host 805. The information may include an indication of the crosstalk frequency and/or severity. At 850, the receiver 810 may (e.g., in response to the crosstalk information), receive control information from the host 805. The control information may indicate the configuration of a cancelation circuit included in the receiver 810. In one example, the control information may indicate specific switching components that the receiver 810 is to activate and/or deactivate. In another example, the control information may include an indication of a cancelation mode that corresponds to a particular configuration of the cancelation circuit. For instance, the cancelation circuit may be capable of providing x variations of cancelation, each associated with a unique combination of bandwidth and strength and each represented by a cancelation mode.

At 855, the receiver 810 may configure the cancelation circuit based on or as indicated by the control information. Configuring the cancelation circuit may include activating and/or deactivating one or more switching components (e.g., by establishing and/or breaking one or more conductive paths within the cancelation circuit). Additionally or alternatively, the receiver 810 may configure the cancelation circuit by modifying the voltage(s) applied to one or more components of the cancelation circuit (e.g., by modifying the control voltage applied to the switching components or a voltage-dependent capacitor).

Although described with the receiver 810 determining the crosstalk characteristics, in some cases the host 805 may determine the crosstalk characteristics. For example, the host 805 may receive the measurement information from the receiver 810 and determine the crosstalk characteristics itself. Regardless of which device determines the crosstalk characteristics, the characteristics may serve as the basis for configuration of the cancelation circuit(s).

Figure 9:
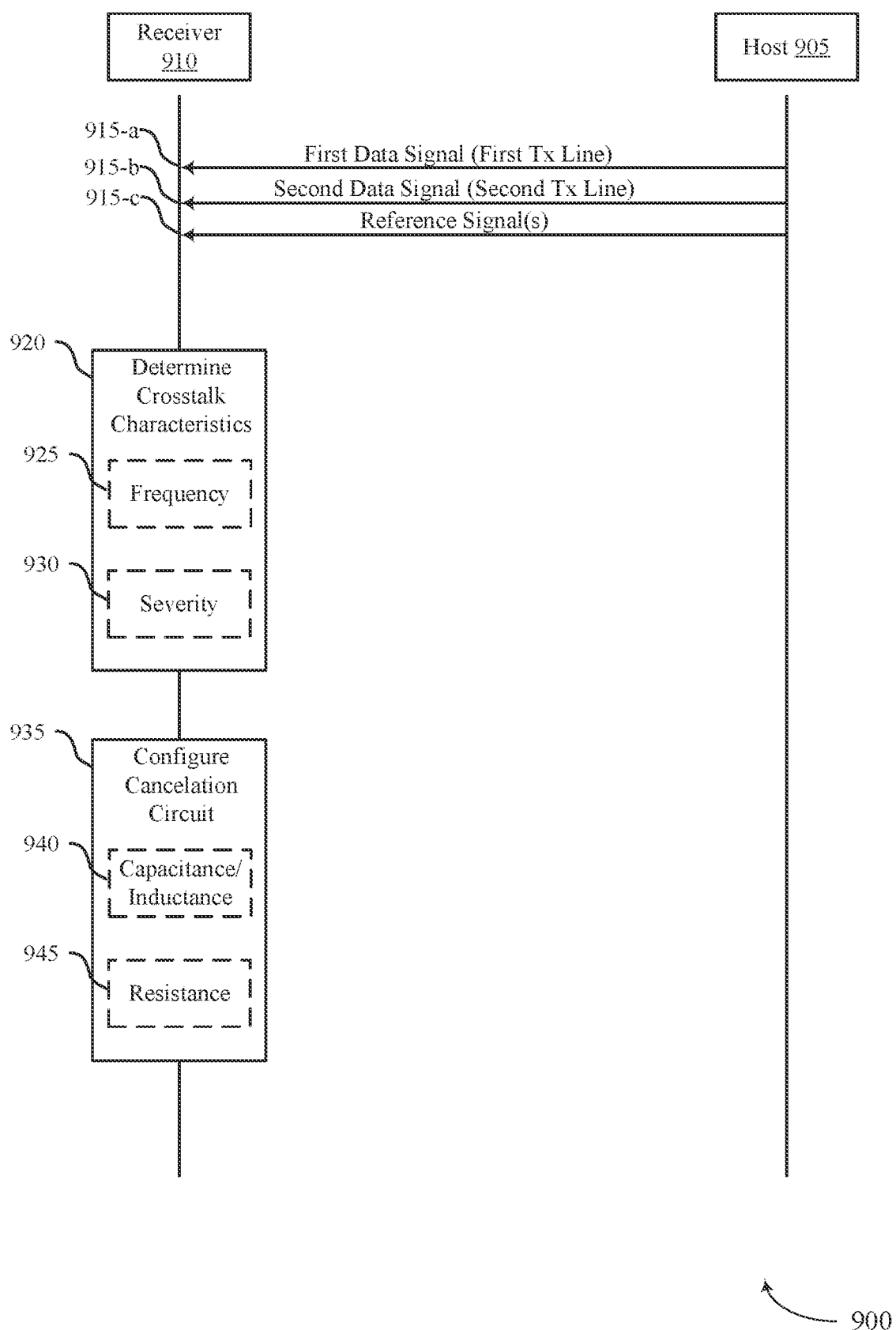
FIG. 9 illustrates an example of a process flow that supports receive-side crosstalk cancelation in accordance with examples as disclosed herein.

FIG. 9 illustrates an example of a process flow 900 that supports receive-side crosstalk cancelation in accordance with various examples as disclosed herein. Aspects of process flow 900 made be performed by a host 905 and a receiver 910. The host 905 may be an example of an external memory controller 105 described with reference to FIG. 1, and the receiver 910 may be an example of a receiver 910 described with reference to FIG. 3. The receiver 910 may include one or more of the cancelation circuits and receive circuits as described with reference to FIGS. 3-7. The process flow 900 may include aspects of an autonomous configuration process for the cancelation circuit(s). Although described with reference to two signals, the configuration techniques of process flow 900 may be implemented for any quantity of signals.

At 915-a, the receiver 910 may receive a first data signal at a first non-inverting input of a first circuit (e.g., a receive circuit). The first data signal may be received over a first transmission line coupled with the first non-inverting input of the first circuit. At 915-b, the receiver 910 may receive a second data signal at a second non-inverting input of a second circuit (e.g., a receive circuit). The second data signal may be received over a second transmission line coupled with the second non-inverting input of the second circuit. At 915-c, the receiver 910 may receive one or more reference signals (e.g., a first reference signal at the inverting input of the first circuit and a second reference signal at the inverting input of the second circuit). The signals received at 915 may be received concurrently or at substantially the same time.

At 920, the receiver 910 may determine one or more characteristics of crosstalk added to the first data signal due to the second data signal. The crosstalk may be determined based at least in part on the reference signal and/or on a comparison with baseline signaling (e.g., as described with reference to FIG. 8). For example, the crosstalk characteristics may be determined based on measurements of the data signals. In some cases, the receiver 910 may, e.g., at 925, determine the signal frequency of the crosstalk contributions caused by the second data signal. Additionally or alternatively, the receiver 910 may determine the severity of the crosstalk contributions (e.g., the ratio of the crosstalk signal to the data signal).

At 935, the receiver 910 may configure the cancelation circuit based on the crosstalk characteristics. For example, at 940, the receiver 910 may adjust the capacitance of the cancelation circuit based on the frequency of the crosstalk signal(s). In such examples, the receiver 910 may establish a conductive path between the inverting input of the first circuit and one or more capacitors or inductors. Thus, the receiver 910 may configure the cancelation bandwidth provided by the cancelation circuit. In another example, the receiver 910 may, e.g., at 945, adjust the resistance of the cancelation circuit based on the severity of crosstalk. In such examples, the receiver 910 may establish a conductive path between the inverting input of the first circuit and one or more resistors. Thus, the receiver 910 may configure the cancelation strength provided by the cancelation circuit. By configuring the capacitance, inductance, and/or resistance of the cancelation circuit, the receiver 910 may tailor the cancelation to compensate for the crosstalk experienced by the first circuit.

Figure 10:
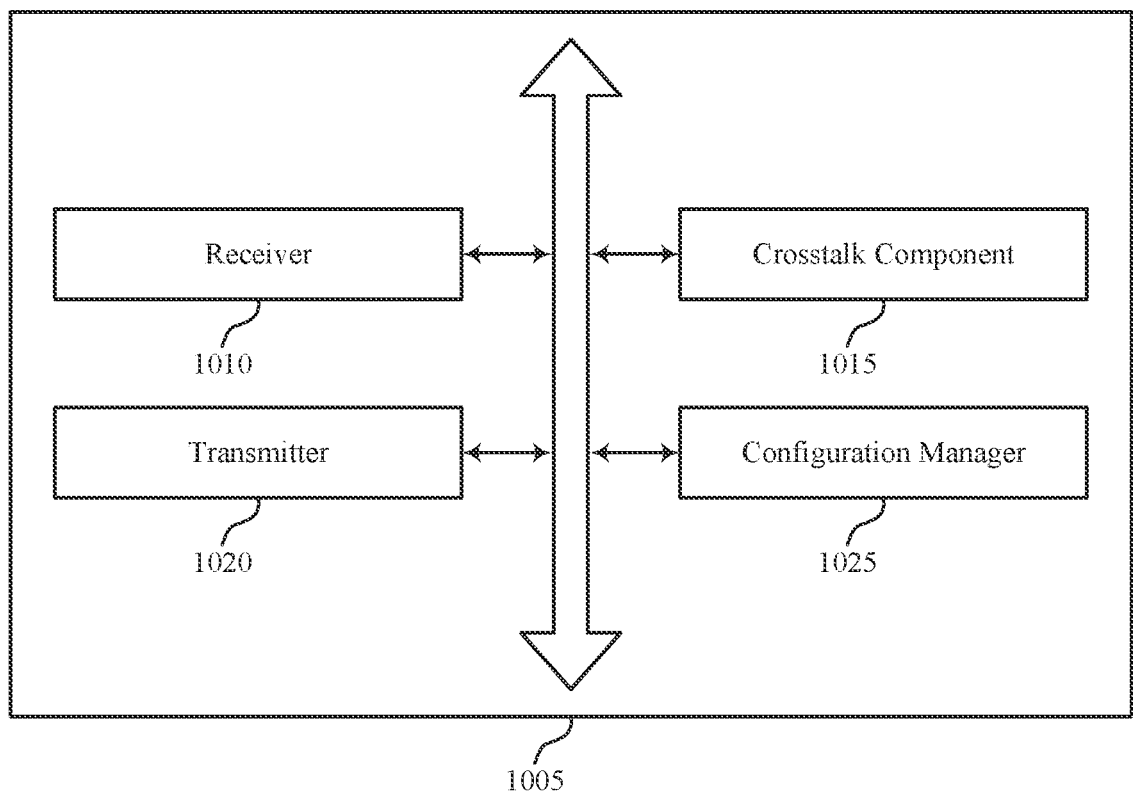
FIG. 10 shows a block diagram of an apparatus that that supports receive-side crosstalk cancelation in accordance with examples as disclosed herein.

FIG. 10 shows a block diagram 1000 of an apparatus 1005 that that supports receive-side crosstalk cancelation in accordance with various examples as disclosed herein. The apparatus 1005 may be an example of a memory device 110 or a memory die 160 described with reference to FIG. 1. The apparatus 1005 may include a receiver 1010, a crosstalk component 1015, a transmitter 1020, and a configuration manager 1025. Each of these modules may communicate, directly or indirectly, with one another (e.g., via one or more buses). The apparatus 1005 may also include one or more cancelation circuits (e.g., coupled with the receiver 1010). One or more of the components shown in apparatus 1005 may be included in or coupled with a controller 320, as described with reference to FIG. 3.

In some cases, the apparatus 1005 may collaborate with a host device to determine a configuration for one or more of its cancelation circuits. In these cases, the receiver 1010 may concurrently receive a first signal over a first transmission line and a second signal over a second transmission line. The crosstalk component 1015 may determine a crosstalk contribution of the second signal to the first signal. The transmitter 1020 may send an indication of the crosstalk contribution to the host device. The receiver 1010 may receive (e.g., in response to the indication) control information indicating a configuration of a circuit (e.g., a cancelation circuit) for canceling crosstalk caused by the second signal. The cancelation circuit may be coupled with the second transmission line and isolated from the first transmission line. And the configuration manager 1025 may configure the cancelation circuit based at least in part on the control information.

The receiver 1010 may be an example of a receiver described with reference to FIGS. 3 through 7. Accordingly, the receiver 1010 may receive various data signals, test signals, control signals, and reference signals over one or more transmission lines. Conversely, the transmitter 1020 may transmit various data signals, test signals, control signals, and reference signals over one or more transmission lines. Although shown as separate components, the receiver 1010 and the transmitter 1020 may be collocated (e.g., within a transceiver). In an example of collaborative configuration, the receiver 1010 may receive a reference signal over a third transmission line.

The crosstalk component 1015 may determine the characteristics of crosstalk experienced by one or more signals (e.g., by making one or more measurements and/or comparisons).

The configuration manager 1025 may configure the cancelation circuit(s) by applying various voltages to various components. When, in the context of collaborative configuration, the receiver 1010 receives the reference signal over the third transmission line, the configuration manager 1025 may configure the circuit for canceling crosstalk by modifying a state of a switching component of the circuit that is coupled with the third transmission line. In such cases, the circuit may include a resistor coupled with the third transmission line. Thus, modifying the state of the switching component may include establishing a conductive path between the resistor and a receiver by activating the switching component.

In some cases of collaborative configuration, the configuration manager 1025 may configured the cancelation circuit by modifying a state of a switching component coupled with a capacitor or inductor of the circuit, where the capacitor or inductor is coupled with the second transmission line. In one example, modifying the state is based at least in part on a cancelation mode indicated by the control information or an indication of the switching component included in the control information. In another example, when the capacitor or inductor is a voltage-controlled capacitor, configuring the cancelation circuit may include modifying a voltage applied to the voltage-controlled capacitor.

In some cases, the apparatus 1005 may configure its cancelation circuit(s) autonomously (e.g., without exchanging control information with the host device). In these instances, the receiver 1010 may receive a first data signal at an input of a first circuit and a reference signal at an inverting input of the first circuit. The receiver 1010 may also receive a second data signal at an input of a second circuit. The crosstalk component 1015 may determine a crosstalk contribution of the second data signal to the first data signal based at least in part on the reference signal. And the configuration manager 1025 may configure a cancelation circuit based at least in part on the crosstalk contribution, cancelation circuit coupled with the inverting input of the first circuit and the input of the second circuit.

In one example of autonomous configuration, the crosstalk component 1015 may determine a level of the crosstalk contribution. In such cases, the configuration manager 1025 may configure the cancelation circuit by establishing a conductive path between the inverting input of the first circuit and one or more resistors based at least in part on determining the level of the crosstalk contribution. The configuration manager 1025 may also isolate one or more resistors from the inverting input of the first circuit.

In another example of autonomous configuration, the crosstalk component 1015 may determine a signal frequency of the crosstalk contribution. In such cases, the configuration manager 1025 may configure the cancelation circuit by establishing a conductive path between the inverting input of the first circuit and one or more capacitors or inductors based at least in part on determining the signal frequency of the crosstalk contribution. The configuration manager 1025 may also isolate one or more capacitors or inductors of the circuit from the inverting input of the first circuit.

Figure 11:
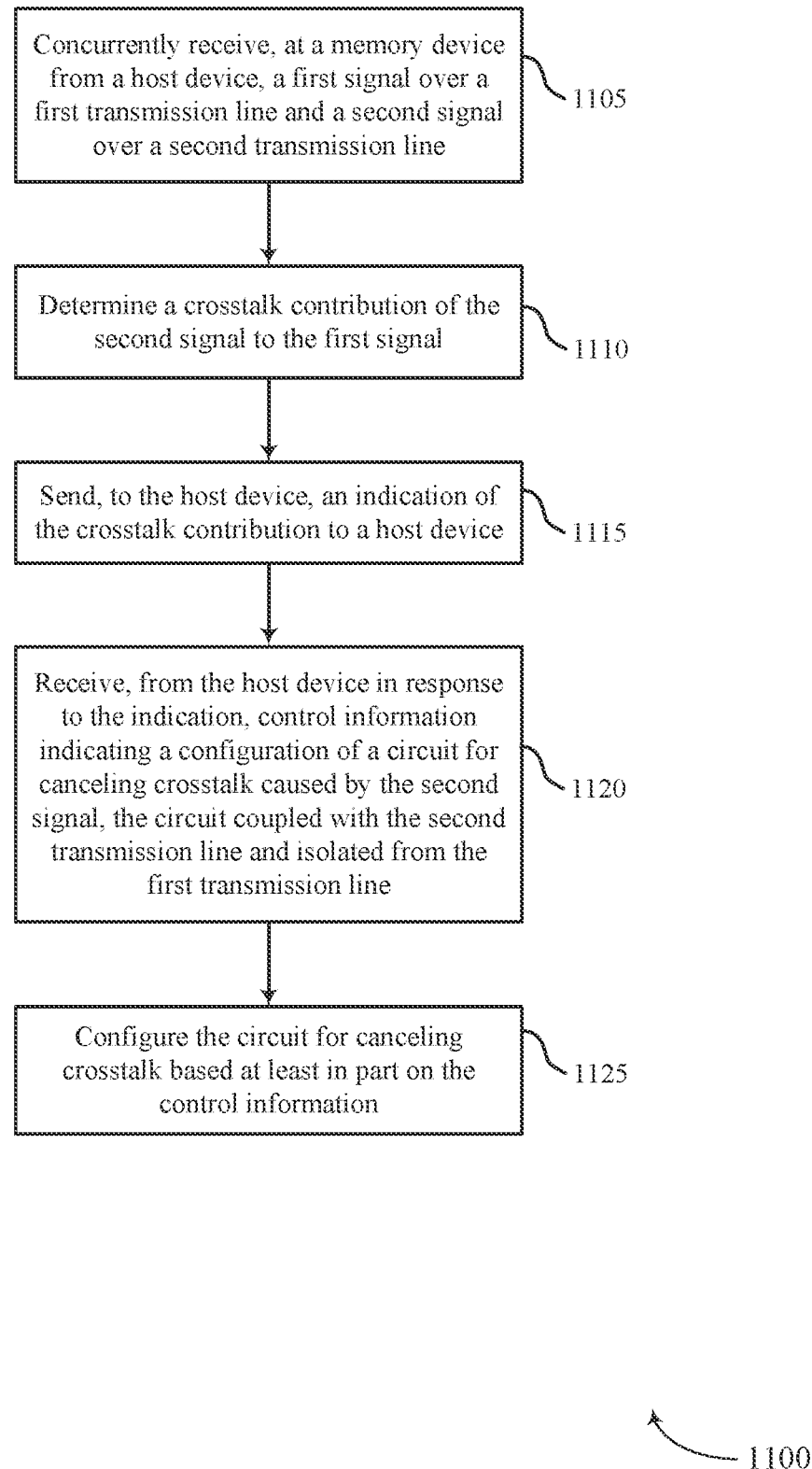
FIGS. 11 through 12 show flowcharts illustrating a method or methods for receive-side crosstalk cancelation in accordance with examples as disclosed herein.

FIG. 11 illustrates an example of a method 1100 that supports receive-side crosstalk cancelation in accordance with various examples as disclosed herein. The operations of method 1100 may facilitate a collaborative configuration process. The operations of method 1100 may be implemented by an apparatus or its components as described herein. For example, the operations of method 1100 may be performed by a receiver as described with reference to FIGS. 3 through 7. In some examples, a memory controller may execute a set of instructions to control the functional elements of the memory device to perform the functions described below. Additionally or alternatively, a memory device may perform aspects of the functions described below using special-purpose hardware.

At 1105, the method may include concurrently receiving, at a memory device from a host device, a first signal over a first transmission line and a second signal over a second transmission line. The operations of 1105 may be performed according to the methods described with reference to FIGS. 3 through 9. In some examples, aspects of the operations of 1105 may be performed by a receiver as described with reference to FIGS. 3 through 7 and 10.

At 1110, the method may include determining a crosstalk contribution of the second signal to the first signal. The operations of 1110 may be performed according to the methods described with reference to FIGS. 3 through 9. In some examples, aspects of the operations of 1110 may be performed by a crosstalk component 1015 as described with reference to FIG. 10.

At 1115, the method may include sending, to the host device, an indication of the crosstalk contribution to a host device. The operations of 1115 may be performed according to the methods described with reference to FIGS. 3 through 9. In some examples, aspects of the operations of 1115 may be performed by a transmitter 1020 as described with reference to FIG. 10.

At 1120, the method may include receiving, from the host device (e.g., in response to the indication), control information indicating a configuration of a circuit for canceling crosstalk caused by the second signal. The circuit may be coupled with the second transmission line and may be isolated from the first transmission line. The operations of 1120 may be performed according to the methods described with reference to FIGS. 3 through 9. In some examples, aspects of the operations of 1120 may be performed by a receiver as described with reference to FIGS. 3 through 7 and 10.

At 1125, the method may include configuring the circuit for canceling crosstalk based at least in part on the control information. The operations of 1125 may be performed according to the methods described with reference to FIGS. 3 through 9. In some examples, aspects of the operations of 1125 may be performed by a configuration manager 1025 as described with reference to FIG. 10.

In some examples, an apparatus as described herein may perform a method or methods, such as the method 1100. The apparatus may include features, means, or instructions (e.g., a non-transitory computer-readable medium storing instructions executable by a processor) for: concurrently receiving a first signal over a first transmission line and a second signal over a second transmission line; determining a crosstalk contribution of the second signal to the first signal; sending an indication of the crosstalk contribution to a host device; receiving, in response to the indication, control information indicating a configuration of a circuit for canceling crosstalk caused by the second signal, where the circuit is coupled with the second transmission line and isolated from the first transmission line; and configuring the circuit for canceling crosstalk based at least in part on the control information.

The apparatus may also include features, means, or instructions for modifying a state of a switching component coupled with a capacitor or inductor of the circuit, the capacitor or inductor coupled with the second transmission line. In some cases, modifying the state is based at least in part on a cancelation mode indicated by the control information or an indication of the switching component included in the control information. In some cases (e.g., when the capacitor or inductor is a voltage-controlled capacitor), the features, means, or instructions for configuring the circuit include features, means, or instructions for modifying a voltage applied to the voltage-controlled capacitor.

The apparatus may also include features, means, or instructions for receiving a reference signal over a third transmission line, wherein configuring the circuit for canceling crosstalk comprises modifying a state of a switching component of the circuit that is coupled with the third transmission line. In such examples, the circuit may include a resistor coupled with the third transmission line. Thus, in some examples, the features, means, or instructions for modifying the state of the switching component include features, means, or instructions for establishing a conductive path between the resistor and a receiver by activating the switching component.

Figure 12:
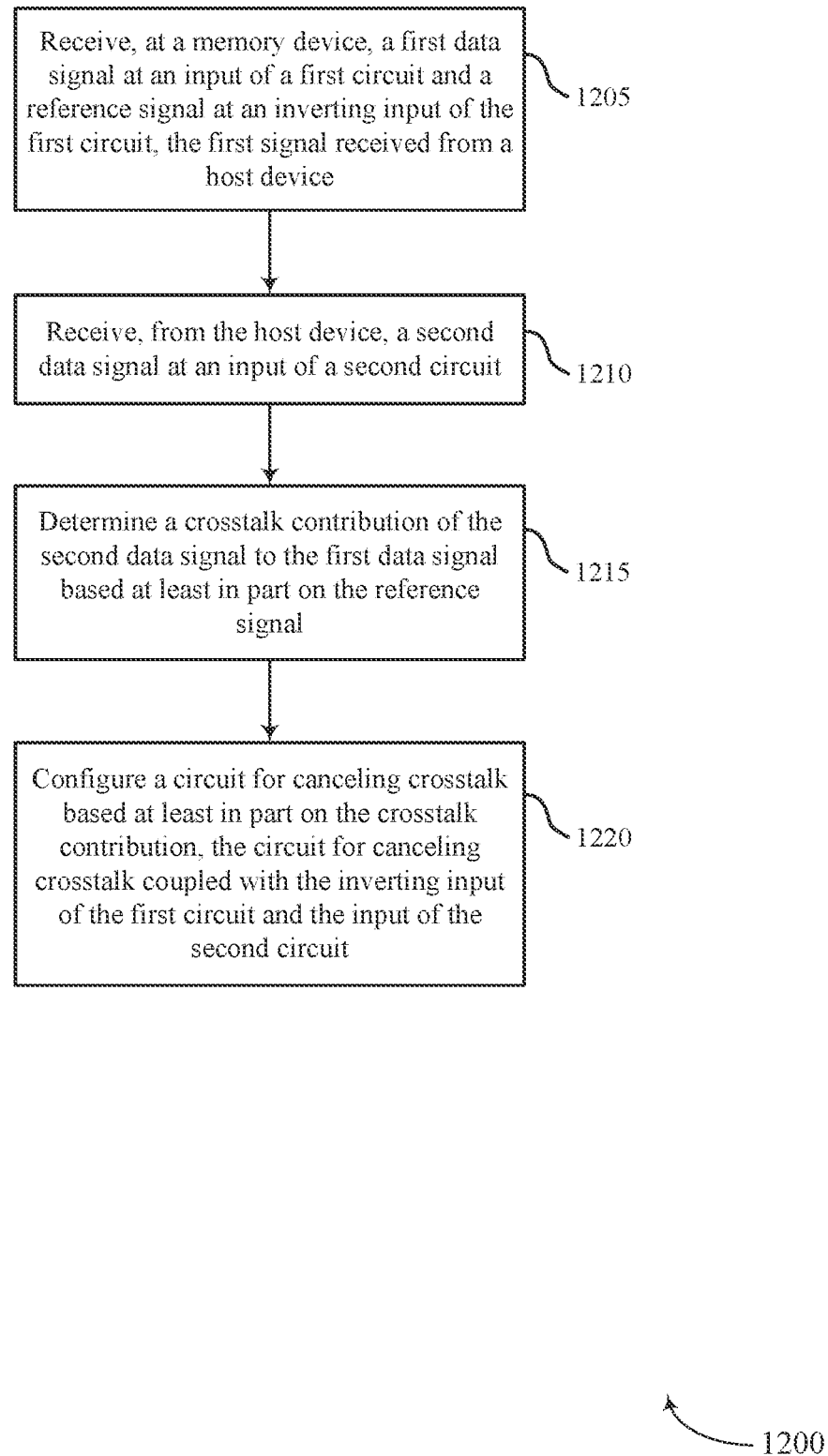

FIG. 12 illustrates an example of a method 1200 that supports receive-side crosstalk cancelation in accordance with various examples as disclosed herein. The operations of method 1200 may facilitate an autonomous configuration process. The operations of method 1200 may be implemented by an apparatus or its components as described herein. For example, the operations of method 1200 may be performed by a receiver as described with reference to FIGS. 3 through 7. In some examples, a memory controller may execute a set of instructions to control the functional elements of the memory device to perform the functions described below. Additionally or alternatively, a memory device may perform aspects of the functions described below using special-purpose hardware.

At 1205, the method may include receiving, at a memory device, a first data signal at an input of a first circuit and a reference signal at an inverting input of the first circuit, the first signal received from a host device. The operations of 1205 may be performed according to the methods described with reference to FIGS. 3 through 9. In some examples, aspects of the operations of 1205 may be performed by a receiver as described with reference to FIGS. 3 through 7 and 10.

At 1210, the method may include receiving, from the host device, a second data signal at an input of a second circuit. The operations of 1210 may be performed according to the methods described with reference to FIGS. 3 through 9. In some examples, aspects of the operations of 1210 may be performed by a receiver as described with reference to FIGS. 3 through 7 and 10.

At 1215, the method may include determining a crosstalk contribution of the second data signal to the first data signal based at least in part on the reference signal. The operations of 1215 may be performed according to the methods described with reference to FIGS. 3 through 9. In some examples, aspects of the operations of 1215 may be performed by a crosstalk component 1015 as described with reference to FIG. 10.

At 1220, the method may include configuring a circuit for canceling crosstalk based at least in part on the crosstalk contribution, the circuit for canceling crosstalk coupled with the inverting input of the first circuit and the input of the second circuit. The operations of 1220 may be performed according to the methods described with reference to FIGS. 3 through 9. In some examples, aspects of the operations of 1220 may be performed by a configuration manager 1025 as described with reference to FIG. 10.

In some examples, an apparatus as described herein may perform a method or methods, such as the method 1200. The apparatus may include features, means, or instructions (e.g., a non-transitory computer-readable medium storing instructions executable by a processor) for: receiving a first data signal at an input of a first circuit and a reference signal at an inverting input of the first circuit; receiving a second data signal at an input of a second circuit; determining a crosstalk contribution of the second data signal to the first data signal based at least in part on the reference signal; and configuring a circuit for canceling crosstalk based at least in part on the crosstalk contribution, the circuit for canceling crosstalk coupled with the inverting input of the first circuit and the input of the second circuit.

The apparatus may also include features, means, or instructions (e.g., a non-transitory computer-readable medium storing instructions executable by a processor) for determining a level of the crosstalk contribution. In such cases, the features, means, or instructions (e.g., a non-transitory computer-readable medium storing instructions executable by a processor) for configuring the circuit may include features, means, or instructions for canceling crosstalk may include establishing a conductive path between the inverting input of the first circuit and one or more resistors based at least in part on determining the level of the crosstalk contribution. The apparatus may also include features, means, or instructions for configuring the circuit may also include isolating one or more resistors from the inverting input of the first circuit.

The apparatus may also include features, means, or instructions for determining a signal frequency of the crosstalk contribution. In such cases, the features, means, or instructions for configuring the circuit may include features, means, or instructions for establishing a conductive path between the inverting input of the first circuit and one or more capacitors or inductors based at least in part on determining the signal frequency of the crosstalk contribution. In some examples, the features, means, or instructions for configuring the circuit may include features, means, or instructions for isolating one or more capacitors or inductors of the circuit from the inverting input of the first circuit.

In some examples, the apparatus that performs aspects of method 1100 and/or 1200 may include: an array of memory cells, each memory cell comprising a capacitive storage element; a controller coupled with the array of memory cells and configured to demodulate or decode data signals or command signals, or both, for the array of memory cells; a first circuit coupled with the controller and comprising a first inverting input configured to amplify a reference signal and a first input configured to amplify a first data signal; a second circuit coupled with the controller and comprising a second inverting input configured to amplify the reference signal and a second input configured to amplify a second data signal; and a capacitor or inductor coupled with the first inverting input and the second input and configured to block a frequency subset of the second data signal that is lower than a threshold frequency.

In some cases, the capacitor or inductor is further configured to pass, to the first inverting input, a second frequency subset of the second data signal that is higher than the threshold frequency.

In some cases, the apparatus includes a switching component coupled with the capacitor or inductor and configured to selectively establish a conductive path comprising the first inverting input and the capacitor or inductor. In such cases, the apparatus may also include a second capacitor or inductor coupled with the second input and a second switching component coupled with the second capacitor or inductor and configured to selectively establish a second conductive path comprising the first inverting input and the second capacitor or inductor.

In some cases, the apparatus may include a resistor coupled with a node configured to provide a reference signal from a circuit for generating voltage, and a switching component configured to selectively establish a conductive path between the resistor and the first inverting input.

In some examples, the apparatus that performs aspects of method 1100 and/or 1200 may include: a memory array comprising a plurality of memory cells; a controller coupled to the memory array; a first receiver coupled with the controller and comprising an inverting input terminal; a second receiver coupled with the controller and comprising an input terminal; a capacitor or inductor coupled with the inverting input terminal of the first receiver and the input terminal of the second receiver; and a resistor coupled with the inverting input terminal and a reference voltage circuit.

In some cases, the apparatus includes a second resistor in series with the resistor, and a switching component coupled with the resistor and the second resistor and positioned along a conductive path comprising the inverting input terminal and the second resistor.

In some cases, the apparatus may include a second resistor in parallel with the resistor, a first switching component in series with the resistor, and a second switching component in series with the second resistor.

In some cases, the apparatus may include a switching component coupled with the capacitor or inductor and positioned along a conductive path comprising the inverting input terminal and the capacitor or inductor. In such cases, the apparatus may also include a second capacitor or inductor coupled with the input terminal and the inverting input terminal, and a second switching component coupled with the second capacitor or inductor and positioned along a second conductive path comprising the second capacitor or inductor and the inverting input terminal.

In some cases, the apparatus may include a second inverting input terminal of the second receiver, and a second input terminal of the first receiver, wherein the capacitor or inductor is isolated from the second inverting input terminal and the second input terminal. In such cases, the apparatus may also include a circuit for generating a reference voltage, wherein the inverting input terminal and the second inverting input terminal are coupled with the circuit. In some cases, the input terminal is coupled with a first transmitter and the second input terminal is coupled with a second transmitter.

It should be noted that the methods described above describe possible implementations, and that the operations and the steps may be rearranged or otherwise modified and that other implementations are possible. Furthermore, aspects from two or more of the methods may be combined.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

As used herein, the term "virtual ground" refers to a node of an electrical circuit that is held at a voltage of approximately zero volts (0V) but that is not directly coupled with ground. Accordingly, the voltage of a virtual ground may temporarily fluctuate and return to approximately 0V at steady state. A virtual ground may be implemented using various electronic circuit elements, such as a voltage divider consisting of operational amplifiers and resistors. Other implementations are also possible. "Virtual grounding" or "virtually grounded" means connected to approximately 0V.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some cases, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals can be communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components from one another, the controller affects a change that prevents signals from flowing between the components using a conductive path that previously permitted signals to flow.

As used herein, the term "substantially" means that the modified characteristic (e.g., a verb or adjective modified by the term substantially) need not be absolute but is close enough to achieve the advantages of the characteristic.

As used herein, the term "shorting" refers to a relationship between components in which a conductive path is established between the components via the activation of a single intermediary component between the two components in question. For example, a first component shorted to a second component may exchange signals with the second component when a switch between the two components is closed. Thus, shorting may be a dynamic operation that enables the flow of charge between components (or lines) that are in electronic communication.

The devices discussed herein, including a memory array, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. A method, comprising:
   receiving, at a receiver from a transmitter, a first signal over a first transmission line and a second signal over a second transmission line;
   sending, to the transmitter, an indication of crosstalk caused by the second signal to the first signal;
   receiving, from the transmitter in response to the indication of crosstalk, control information indicating a configuration of a circuit for suppressing crosstalk, the circuit coupled with the second transmission line; and
   configuring the circuit for suppressing the crosstalk based at least in part on the control information.

2. The method of claim 1, further comprising:
   determining a crosstalk contribution based at least in part on the crosstalk caused by the second signal to the first signal, wherein the indication of crosstalk is based at least in part on the crosstalk contribution.

3. The method of claim 1, wherein the first signal and the second signal are received concurrently.

4. The method of claim 1, wherein a distance between the first transmission line and the second transmission line is less than a threshold.

5. The method of claim 1, wherein the first signal, the second signal, or both are single-ended signals.

6. The method of claim 1, further comprising receiving a reference signal over a third transmission line, wherein configuring the circuit for suppressing the crosstalk comprises modifying a state of a switching component of the circuit that is coupled with the third transmission line.

7. The method of claim 1, wherein the indication of crosstalk comprises an indication of a frequency of the crosstalk.

8. The method of claim 1, wherein the indication of crosstalk comprises an indication of an amplitude of the crosstalk.

9. A method, comprising:
receiving, at a receiver, a first data signal at an input of a first circuit and a reference signal at an inverting input of the first circuit, the first data signal received from a transmitter;
receiving, from the transmitter, a second data signal at an input of a second circuit; and
configuring a circuit for suppressing crosstalk using a crosstalk contribution of the second data signal to the first data signal based at least in part on the reference signal, the circuit for suppressing crosstalk coupled with the inverting input of the first circuit and the input of the second circuit.

10. The method of claim 9, further comprising:
determining the crosstalk contribution of the second data signal to the first data signal based at least in part on the reference signal.

11. The method of claim 9, wherein the crosstalk contribution is based at least in part on a difference between the first data signal and the second data signal.

12. The method of claim 9, wherein configuring the circuit comprises establishing a conductive path between the inverting input of the first circuit and one or more capacitors or inductors based at least in part on the crosstalk contribution.

13. The method of claim 12, wherein establishing the conductive path comprises activating one or more switching components of the circuit.

14. An apparatus, comprising:
a first receiver comprising an inverting input terminal and an input terminal;
a second receiver comprising a second input terminal and a second inverting input terminal;
a transformer having a first winding coupled with the inverting input terminal of the first receiver and having a second winding coupled with the second input terminal of the second receiver, wherein the transformer is isolated from the second inverting input terminal and the input terminal; and
a resistor coupled with the first winding of the transformer and a reference voltage circuit.

15. The apparatus of claim 14, further comprising:
a memory array comprising a plurality of memory cells.

16. The apparatus of claim 15, further comprising:
a controller coupled with the memory array, the controller further coupled with the first receiver, the second receiver, or both, the controller configured to demodulate or decode data signals or command signals, or both, for the memory array.

17. The apparatus of claim 14, wherein the transformer is configured to block a frequency subset of a data signal that is lower than a threshold frequency.

18. The apparatus of claim 17, wherein the transformer is further configured to pass, to the inverting input terminal, a second frequency subset of the data signal that is higher than the threshold frequency.

19. The apparatus of claim 14, further comprising:
a third receiver comprising a third input terminal and a third inverting input terminal; and
a second transformer coupled with the second inverting input terminal and the third input terminal.

20. The apparatus of claim 14, wherein the first receiver, the second receiver, or both are operational amplifiers.

* * * * *